(12) United States Patent
Wang et al.

(10) Patent No.: US 11,245,076 B2
(45) Date of Patent: Feb. 8, 2022

(54) PEROVSKITE OPTOELECTRONIC DEVICE, PREPARATION METHOD THEREFOR AND PEROVSKITE MATERIAL

(71) Applicant: NANJING TECH UNIVERSITY, Nanjing (CN)

(72) Inventors: Jianpu Wang, Nanjing (CN); Nana Wang, Nanjing (CN); Rui Ge, Nanjing (CN); Wei Huang, Nanjing (CN)

(73) Assignee: NANJING TECH UNIVERSITY, Nanjing (CN)

( * ) Notice: Subject to any disclaimer, the term of this patent is extended or adjusted under 35 U.S.C. 154(b) by 670 days.

(21) Appl. No.: 16/068,651

(22) PCT Filed: Jan. 17, 2017

(86) PCT No.: PCT/CN2017/071351
§ 371 (c)(1),
(2) Date: Jul. 6, 2018

(87) PCT Pub. No.: WO2017/128987
PCT Pub. Date: Aug. 3, 2017

(65) Prior Publication Data
US 2019/0036030 A1    Jan. 31, 2019

(30) Foreign Application Priority Data

Jan. 26, 2016 (CN) .......................... 201610051400.4

(51) Int. Cl.
*H01L 51/00* (2006.01)
*C09K 11/06* (2006.01)
*H01L 51/50* (2006.01)
*H01L 51/42* (2006.01)
*H01L 51/44* (2006.01)
(Continued)

(52) U.S. Cl.
CPC ........ *H01L 51/0051* (2013.01); *H01L 51/005* (2013.01); *H01L 51/0055* (2013.01);
(Continued)

(58) Field of Classification Search
CPC ............. H01L 51/512; H01L 51/00512; H01L 51/0034-006; C09K 11/06; C09K 11/664; C09K 11/665
See application file for complete search history.

(56) References Cited

U.S. PATENT DOCUMENTS

2015/0200377 A1\* 7/2015 Etgar .................... H01L 51/005
                                                                                              136/256
2018/0315870 A1\* 11/2018 Snaith ................... H01L 31/036

OTHER PUBLICATIONS

Tan. Bright light-emitting diodes based on organometal halide perovskite. Nature Nanotechnology | vol. 9 | Sep. 2014.\*
(Continued)

*Primary Examiner* — Matthew E. Hoban
(74) *Attorney, Agent, or Firm* — CBM Patent Consulting, LLC

(57) ABSTRACT

It discloses a perovskite optoelectronic device which includes a substrate, electrode layers and functional layers. The electrode layer is deposited on the substrate, the functional layer is deposited between the electrode layers, and the functional layer at least includes a perovskite layer, wherein the perovskite layer is a perovskite material possessing a self-organized multiple quantum well structure. By adjusting material components, controllable adjustment of the structure of the multiple quantum wells and effective energy transfer between the multiple quantum wells can be implemented, and light emitting color may be near-ultraviolet light, visible light and near-infrared light; moreover, the problems of low coverage and poor stability of the existing perovskite films can be effectively solved.

12 Claims, 15 Drawing Sheets

$A_2B_{N-1}M_NX_{3N+1}$

(51) Int. Cl.
*H01L 51/52* (2006.01)
*H01L 51/56* (2006.01)
*H01S 5/36* (2006.01)

(52) U.S. Cl.
CPC ...... *H01L 51/0064* (2013.01); *H01L 51/0067* (2013.01); *H01L 51/424* (2013.01); *H01L 51/4213* (2013.01); *H01L 51/4226* (2013.01); *H01L 51/441* (2013.01); *H01L 51/5012* (2013.01); *H01L 51/5203* (2013.01); *H01L 51/56* (2013.01); *H01L 51/0037* (2013.01); *H01L 2251/308* (2013.01); *H01S 5/36* (2013.01); *Y02E 10/549* (2013.01); *Y02P 70/50* (2015.11)

(56) References Cited

OTHER PUBLICATIONS

Chen. Under the spotlight: The organic-inorganic hybrid halide perovskite for optoelectronic applications, nanotoday. vol. 10, Issue 3, Jun. 2015, pp. 355-396.*

Kitazawa. Optical Properties of the Natural Quantum-Well System (C6HsC2H4NH3)2(CH3NH3)m.ll~mX3m§ (X; halogen). Proceedings of the Third Okinaga Symposium on Materials Science and Engineering Serving Society, Chiba, Japan, Sep. 3-5, 1997, 1998, pp. 323-326 (Year: 1997).*

* cited by examiner

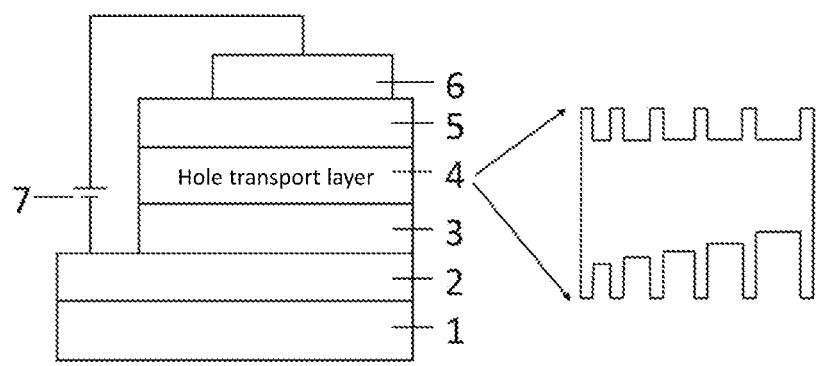
FIG. 1
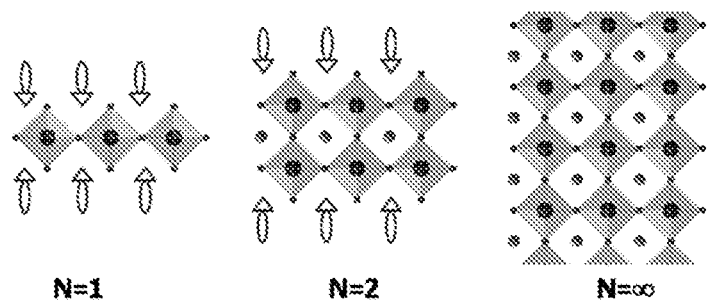
$A_2B_{N-1}M_NX_{3N+1}$
FIG. 2
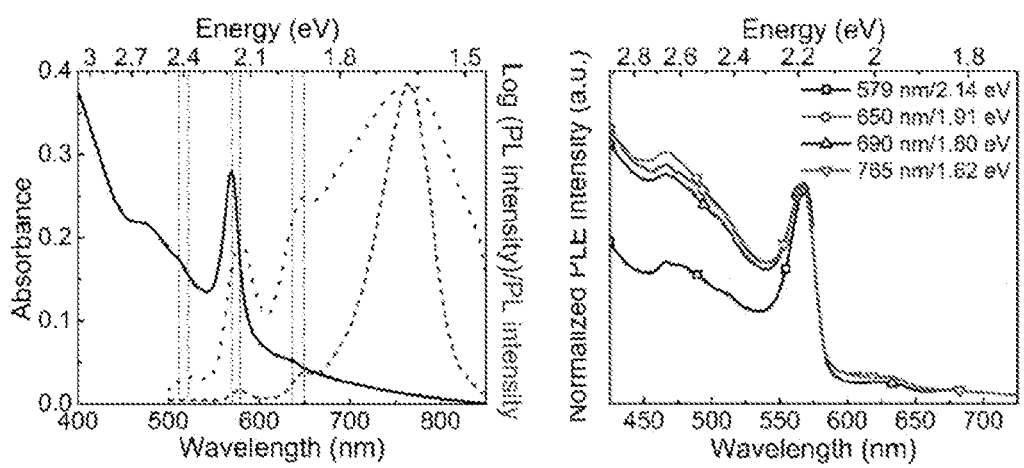
FIG. 3
FIG. 4

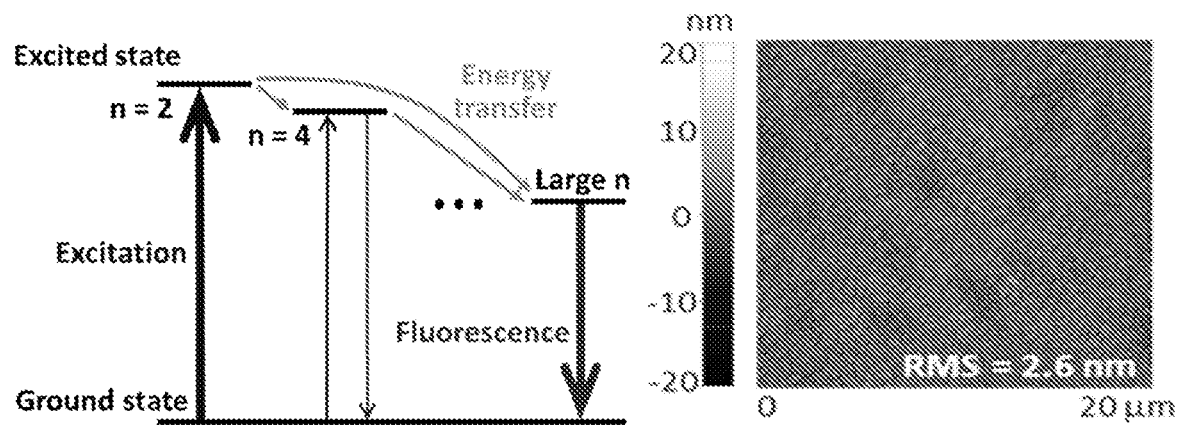
FIG. 5  FIG. 6
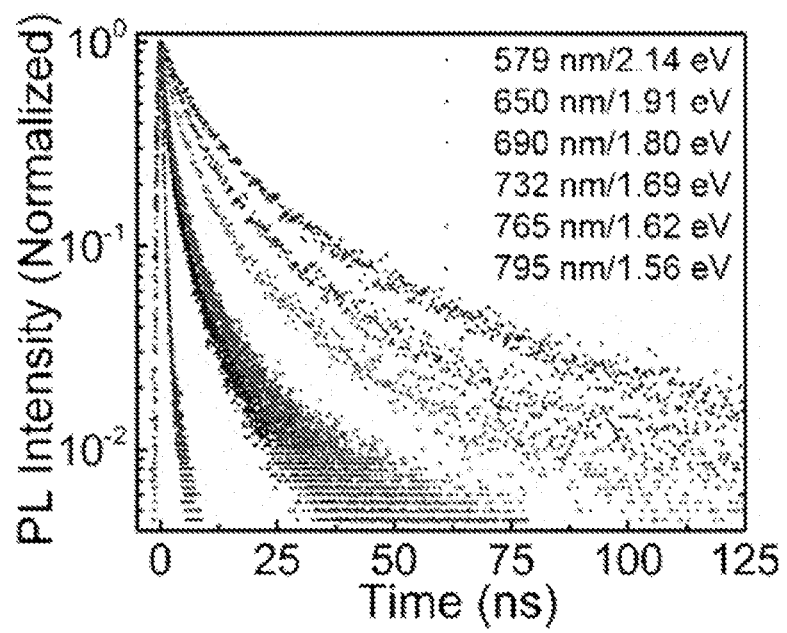
FIG. 7

PEROVSKITE OPTOELECTRONIC DEVICE, PREPARATION METHOD THEREFOR AND PEROVSKITE MATERIAL

TECHNICAL FIELD

The present invention relates to a device based on a perovskite material having a self-organized multiple quantum well structure, a preparation method, and a perovskite material having a self-organized multiple quantum well structure.

BACKGROUND

Since the 21$^{st}$ century, with the development of human society and improvement of living standards, energy sources and environment are confronted with severe challenge, and it becomes an urgent need of people to develop novel green and environmental-friendly devices with low power consumption. In recent years, an organic-inorganic hybrid perovskite material which is available in good quantity and at a good price, and can prepare optoelectronic devices in large area with low cost through a low temperature solution process has drawn the attention of researchers in the related arts from all over the world. A perovskite film is one of few crystal films with excellent charge transfer property and meanwhile, as a direct-bandgap semiconductor material, it has excellent light emitting property, wherein the photoluminescence quantum efficiency thereof is as high as 70%, and the light emitting wavelength can be adjusted through an energy band engineering. However, the problems of poorer film properties and stability of the present 3D perovskite material have become important factors that limit the properties of light emitting devices and photovoltaic devices. Although two-dimensional layered perovskite films have better film properties and stability, the photoluminescence quantum efficiency of the device is low, and device can emit light only under a low temperature condition. Therefore, it is very necessary to further optimize the perovskite material and the device structure to improve the efficiency and stability of the device.

SUMMARY

Object of the Invention

In order to solve the technical problems in the prior art, this invention provides a perovskite material having high photoluminescence quantum efficiency and self-organized multiple quantum well structure, and an optoelectronic device thereof.

Another technical problem to be solved by this invention is to provide applications of the foregoing perovskite material and an application method thereof.

Technical Solution

The perovskite optoelectronic device according to this invention includes a substrate, electrode layers and functional layers. The electrode layer is deposited on the substrate, the functional layer is deposited between the electrode layers, and the functional layer at least includes a perovskite layer, wherein the perovskite layer is a perovskite material having a self-organized multiple quantum well structure, and energy transfers can be implemented between the multiple quantum wells.

Further, the self-organized multiple quantum wells comprise quantum wells with various energy gaps, the energy gaps thereof being distributed from wide to narrow, from narrow to wide or distributed randomly, and the band gap is 0.1 eV-5 eV.

Further, the perovskite material is prepared from $AX^1$, $BX^2$ and $MX^3_2$ with a molar ratio of 1-100:1-100:1-100;

A is $R^1$—$Y^+$, $R^1$ is aliphatic hydrocarbyl having 1-50 carbon atoms, cycloaliphatic hydrocarbyl having 5-100 carbon atoms, optionally substituted aryl having 6-100 carbon atoms or optionally substituted heterocyclic radical having 3-100 carbon atoms, and $Y^+$ is any one of amine, pyridine or imidazole organic cation;

B is $R^2$—$NH_3^+$ or alkali metal ion, and $R^2$ is a group having one carbon atom;

M is a metallic element; and $X^1$, $X^2$ and $X^3$ are halogen elements respectively and independently.

Further, A is $R^1$—$Y^+$, and $R^1$ is aliphatic hydrocarbyl having 1-20 carbon atoms, cycloaliphatic hydrocarbyl having 5-50 carbon atoms, optionally substituted aryl having 6-50 carbon atoms or optionally substituted heterocyclic radical having 3-50 carbon atoms, and $Y^+$ is any one of amine, pyridine or imidazole organic cation.

Further, A is selected from any one or more of the following organic cations:

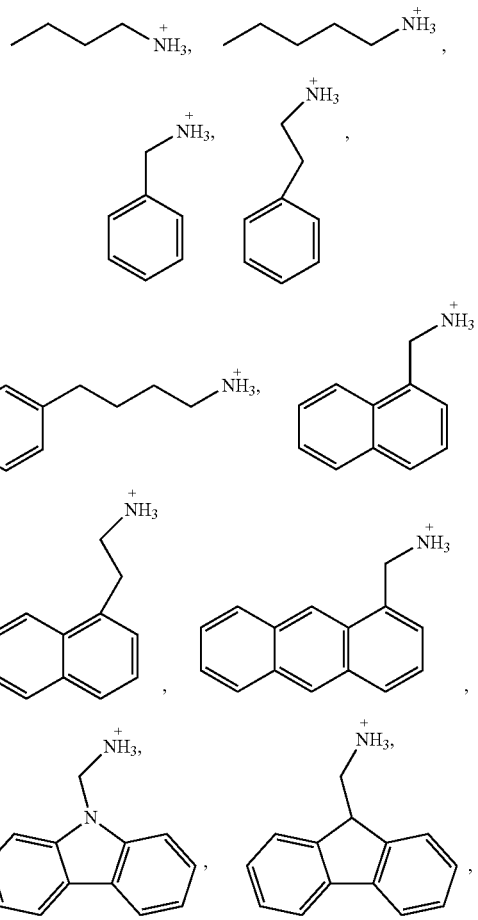

-continued

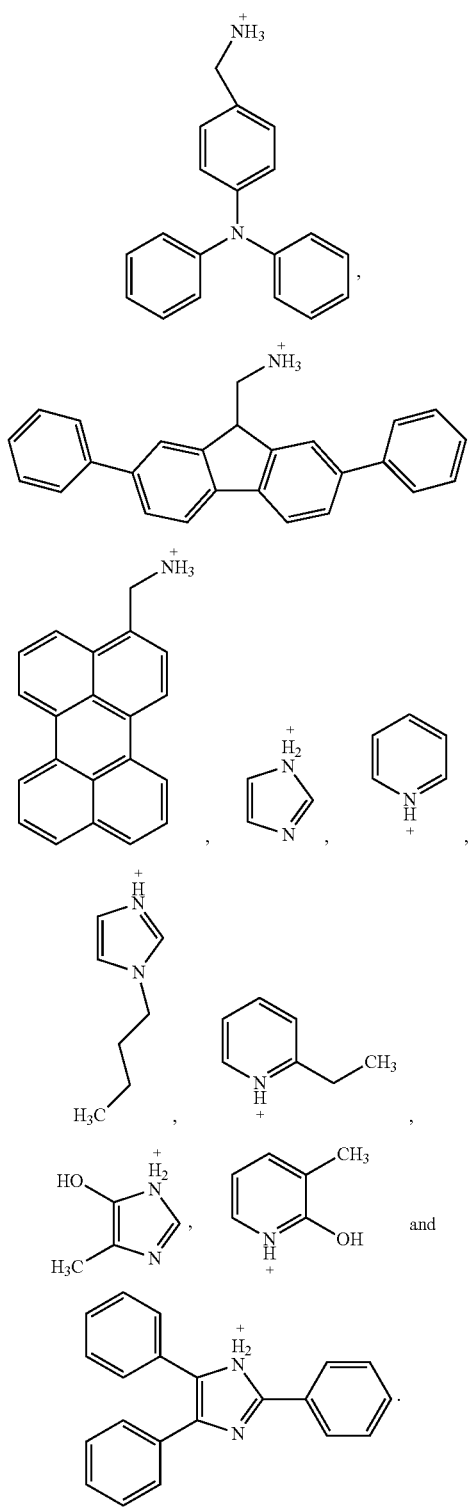

Further, A is $R^1$—$(Y^+)_2$, and $R^1$ is aliphatic hydrocarbyl having 1-20 carbon atoms, cycloaliphatic hydrocarbyl having 5-50 carbon atoms, optionally substituted aryl having 6-50 carbon atoms or optionally substituted heterocyclic radical having 3-50 carbon atoms, and $Y^+$ is any one or any combination of several of amine, pyridine or imidazole organic cation.

Further, A is selected from any one or more of the following organic cations:

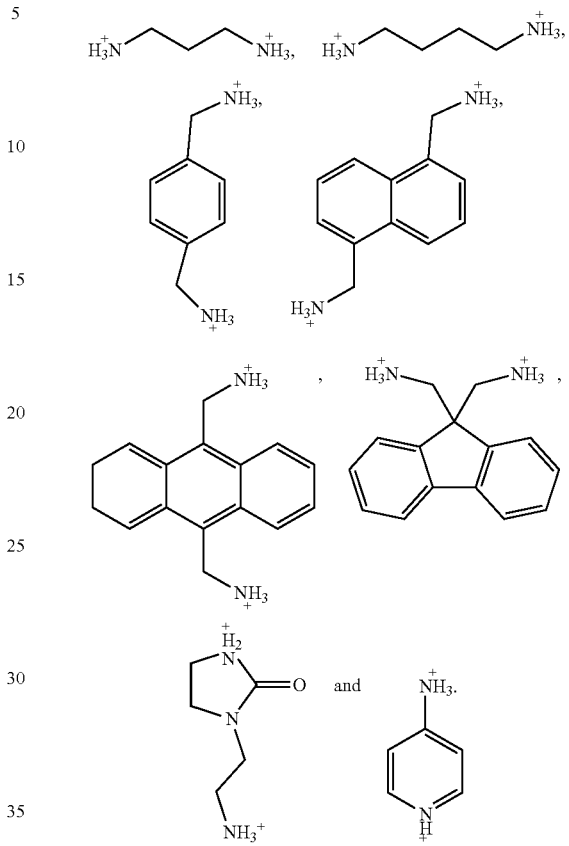

Further, B is any one or any combination of several of organic amine groups like methylamine and formamidinium, $K^+$, $Rb^+$ and $Cs^+$.

Further, the metallic element M is any one of main group IV metals $Pb^{2+}$, $Ge^{2+}$ and $Sn^{2+}$, or any one of transition metals $Cu^{2+}$, $Ni^{2+}$, $Co^{2+}$, $Fe^{2+}$, $Mn^{2+}$, $Cr^{2+}$, $Pd^{2+}$, $Cd^{2+}$, $Eu^{2+}$ and $Yb^{2+}$, or a combination of several of the foregoing metallic elements.

Further, $X^1$, $X^2$ and $X^3$ are selected from any one or any combination of several of Cl, Br and I respectively and independently.

Further, the perovskite material is prepared by employing a method of spin-coating a precursor solution prepared by $AX^1$, $BX^2$ and $MX^3{}_2$ on the substrate, and evaporating the precursor material using an evaporation method, or employing a method of combining the evaporation method with a solution method, which has a self-organized multiple quantum well structure, and energy transfer between the multiple quantum wells can be implemented.

A preparation method for the perovskite optoelectronic device according to the present invention includes the following steps of:

(1) using an acetone solution, an ethanol solution and deionized water to conduct ultrasonic cleaning on a substrate in sequence, and drying the substrate after cleaning;

(2) transferring the substrate to a vacuum chamber to prepare an electrode layer;

(3) transferring the substrate with a prepared electrode layer into a vacuum chamber for oxygen plasma pretreatment;

(4) depositing functional layers on the treated substrate in sequence through a solution method according to the structure of the device, wherein the functional layer at least includes a perovskite layer, and selectively comprises any one or more of an electronic and/or hole transport layer, an electronic and/or hole blocking layer;

(5) preparing another electrode layer in a vacuum evaporation chamber after finishing the preparation of the functional layer films; and (6) packaging the prepared device in a glovebox, wherein the glovebox is in an inert atmosphere.

Further, in step (4), functional layers are prepared on the treated substrate in the vacuum evaporation chamber using an evaporation method, and the functional layers are evaporated in sequence according to the structure of the device; or the functional layers are prepared in the high vacuum chamber in sequence on the treated substrate using a method of combining an evaporation method with a solution method according to the structure of the device.

The perovskite material according to this invention is prepared from $AX^1$, $BX^2$ and $MX^3_2$ with a molar ratio of 1-100:1-100:1-100;

A is $R^1$—$Y^+$, $R^1$ is aliphatic hydrocarbyl having 1-50 carbon atoms, cycloaliphatic hydrocarbyl having 5-100 carbon atoms, optionally substituted aryl having 6-100 carbon atoms or optionally substituted heterocyclic radical having 3-100 carbon atoms, and $Y^+$ is any one of amine, pyridine or imidazole organic cation;

B is $R^2$—$NH_3^+$ or alkali metal ion, and $R^2$ is a group having one carbon atom;

M is a metallic element; and $X^1$, $X^2$ and $X^3$ are halogen elements respectively and independently.

Further, A is $R^1$—$Y^+$, and $R^1$ is aliphatic hydrocarbyl having 1-20 carbon atoms, cycloaliphatic hydrocarbyl having 5-50 carbon atoms, optionally substituted aryl having 6-50 carbon atoms or optionally substituted heterocyclic radical having 3-50 carbon atoms, and $Y^+$ is any one of amine, pyridine or imidazole organic cation.

Further, A is selected from any one or more of the following organic cations:

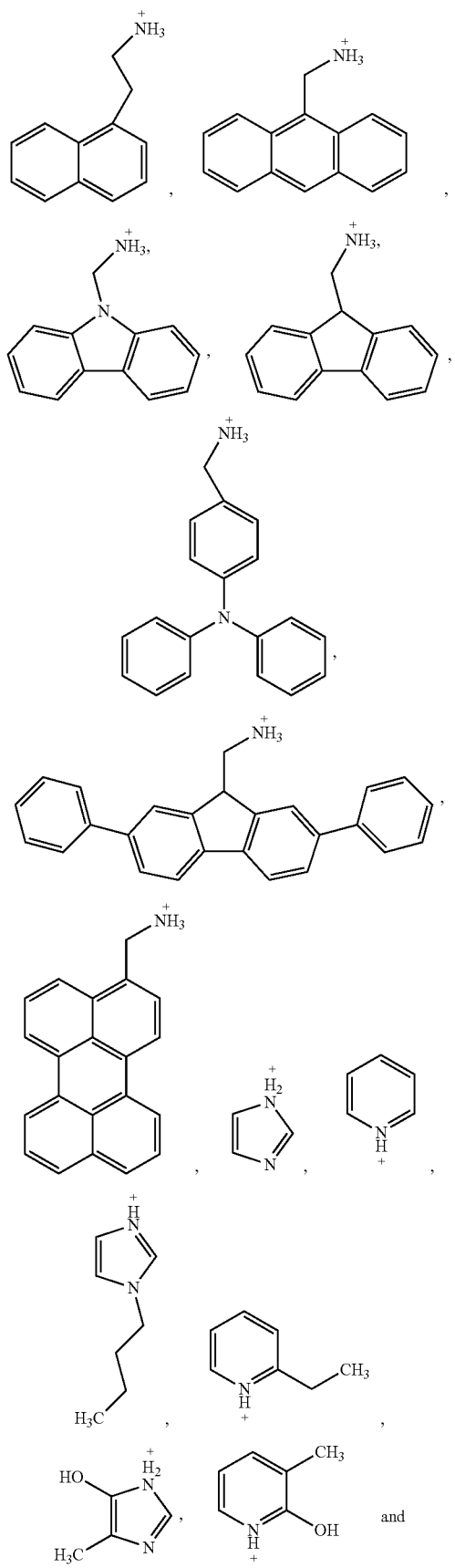

-continued

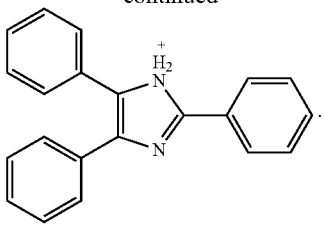

Further, A is R¹—(Y⁺)₂, and R¹ is aliphatic hydrocarbyl having 1-20 carbon atoms, cycloaliphatic hydrocarbyl having 5-50 carbon atoms, optionally substituted aryl having 6-50 carbon atoms or optionally substituted heterocyclic radical having 3-50 carbon atoms, and Y⁺ is any one or any combination of several of amine, pyridine or imidazole organic cation.

Further, A is selected from any one or more of the following organic cations:

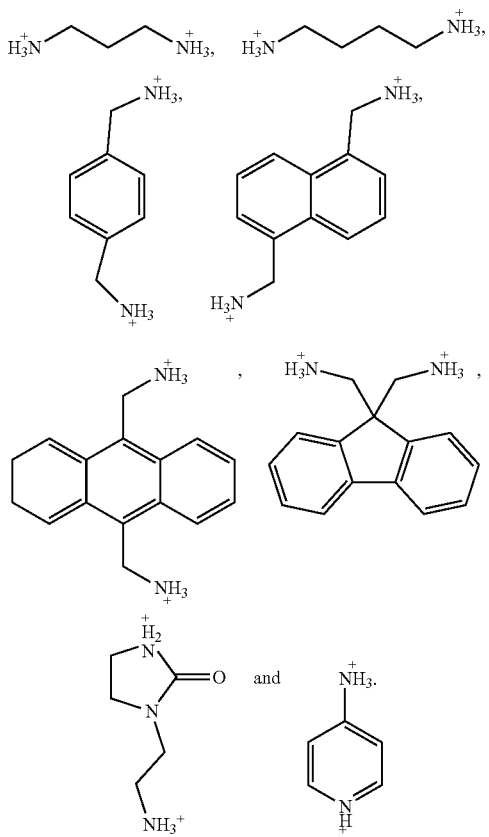

Further, B is any one or any combination of several of organic amine groups like methylamine and formamidinium, $K^+$, $Rb^+$ and $Cs^+$.

Further, the metallic element M is any one of main group IV metals $Pb^{2+}$, $Ge^{2+}$ and $Sn^{2+}$, or any one of transition metals $Cu^{2+}$, $Ni^{2+}$, $Co^{2+}$, $Fe^{2+}$, $Mn^{2+}$, $Cr^{2+}$, $Pd^{2+}$, $Cd^{2+}$, $Eu^{2+}$ and $Yb^{2+}$, or a combination of several of the foregoing metallic elements.

Further, $X^1$, $X^2$ and $X^3$ are selected from any one or any combination of several of Cl, Br and I respectively and independently.

Further, the perovskite material is prepared by employing a method of spin-coating a precursor solution prepared by $AX^1$, $BX^2$ and $MX^3_2$ on the substrate, and evaporating the precursor material using an evaporation method, or employing a method of combining the evaporation method with a solution method, which has a self-organized multiple quantum well structure, and energy transfer between the multiple quantum wells can be implemented.

Advantageous effects: compared with the prior art, the present invention discloses a perovskite optoelectronic device which includes the substrate, the electrode layers and the functional layers, the functional layer is deposited between the electrode layers, and the functional layer at least includes the perovskite layer. Wherein, the perovskite layer is a perovskite material having a self-organized multiple quantum well structure. By adjusting material components, controllable adjustment of the structure of the multiple quantum wells and effective energy transfer between the multiple quantum wells can be implemented, and light emitting color may be near-ultraviolet light, visible light and near-infrared light; moreover, the problems of low coverage and poor stability of the existing perovskite films can be effectively solved. The material is suitable to be used as a light emitting material, which can greatly improve the luminous efficiency and lifetime of the device, and can also be used as an photoactive layer and applied in a photovoltaic device, which can effectively improve the open circuit voltage and power conversion efficiency of the device; meanwhile, the material can be used as a transport layer, which effectively improves the property of the device. The layered perovskite material prepared according to the present invention can be prepared using a solution method or a vacuum evaporation method, which is very suitable for the industrialized production of devices with easy process, low cost, large area, flexible substrate and high efficiency.

BRIEF DESCRIPTION OF THE DRAWINGS

FIG. 1 is a schematic structure diagram of a perovskite device provided by the present invention;

FIG. 2 is a structure diagram of a perovskite material provided by the present invention;

FIG. 3 is the absorption and photoluminescence spectra of a perovskite material of a second embodiment provided by the present invention;

FIG. 4 is the photoexcitation spectra of a perovskite film of the second embodiment provided by the present invention;

FIG. 5 is a schematic diagram of an energy transfer process for the perovskite film of the second embodiment provided by the present invention;

FIG. 6 is an AFM image of the perovskite film of the second embodiment provided by the present invention;

FIG. 7 is the time-resolved PL decay transient of the perovskite film of the second embodiment provided by the present invention;

DETAILED DESCRIPTION

Figure 8:
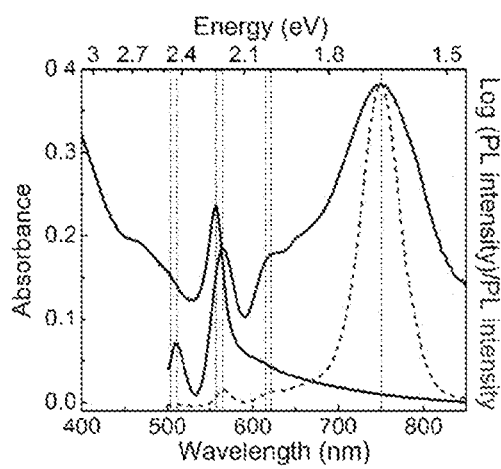
FIG. 8 is the absorption and photoluminescence spectra of a perovskite material of a third embodiment provided by the present invention.

In order to make the foregoing objects, features and advantages of the present invention more apparent and easier to understand, the present invention will be described in details with reference to the embodiments hereinafter.

The technical solution of the present invention provides a perovskite optoelectronic device. As shown in FIG. 1, the device includes a transparent substrate 1, a cathode layer 2, an electron transport layer 3, an emitting layer 4, a hole transport layer 5 and an anode layer 6, wherein the cathode layer 2 is located on the surface of the transparent substrate 1, and the device works under the drive of an external power supply 7. Wherein, the perovskite layer is a perovskite material having a self-organized multiple quantum well structure. As shown in FIG. 2, the general structure of the material is a layered perovskite material prepared from $AX^1$, $BX^2$ and $MX^3{}_2$ with a molar ratio of a:b:c, wherein, a:b:c=(1-100):(1-100):(1-100), and wherein, A is $R^1$—$Y^+$, $R^1$ is aliphatic hydrocarbyl having 1-50 carbon atoms, cycloaliphatic hydrocarbyl having 5-100 carbon atoms, optionally substituted aryl having 6-100 carbon atoms or optionally substituted heterocyclic radical having 3-100 carbon atoms, and $Y^+$ is any one of amine, pyridine or imidazole organic cation; B is $R^2$—$NH_3{}^+$ or alkali metal ion, and $R^2$ is a group having one carbon atom; M is a metallic element; and $X^1$, $X^2$ and $X^3$ are halogen elements respectively and independently. When $X^1$, $X^2$ and $X^3$ are uniformly represented by X, the structural formula thereof can be represented as $A_2B_{N-1}M_NX_{3N+1}$, wherein N is the number of layers of inorganic frameworks of the perovskite material. By adjusting the composition of $AX^1$, $BX^2$ and $MX^3{}_2$, the layered perovskite material with different components and having a self-organized multiple quantum well structure can be implemented. The representative material $AX^1$ used refers to $C_{10}H_7CH_2NH_3I$, $C_{10}H_7CH_2NH_3Br$, $C_6H_5CH_2NH_3I$, $C_6H_5(CH_2)_2NH_3I$ and $C_6H_5(CH_2)_4NH_3I$, $BX^2$ refers to $CH_3NH_3I$, $NH_2CH$=$NH_2I$, $NH_2CH$=$NH_2Br$, $NH_2CH$=$NH_2Cl$, CsI, CsBr and CsCl, and $MX^3{}_2$ refers to $PbI_2$, $PbBr_2$ and $PbCl_2$, however, $AX^1$, $BX^2$ and $MX^3{}_2$ used include but are not limited to this.

The above is the core concept of the present invention, and the technical solutions in the embodiments of the present invention will be clearly and completely described with reference to the drawings and embodiments hereinafter. Apparently, the embodiments described are merely partial embodiments of the present invention, but are not limited to these embodiments. Other embodiments derive by those having ordinary skills in the art on the basis of the embodiments of the present invention without going through creative efforts shall all fall within the protection scope of this invention.

First Embodiment: Preparation of $AX^1$

A preparation method of $AX^1$ is as follows: A was dissolved in tetrahydrofuran, and then hydroiodic acid is added for reaction for 60 min, till the pH value of a reaction solution is 4, and solid powder is obtained after removing solvent by rotatably evaporating, and the powder obtained was washed and subjected to suction filtration for three times using ethyl ether, thus obtaining $AX^1$. The synthesis method of $C_{10}H_7CH_2NH_3I$ is taken for example hereinafter. Firstly, aromatic amine $C_{10}H_7CH_2NH_2$ was dissolved in tetrahydrofuran, and then hydroiodic acid was added for reaction for 60 min, till the pH value of a reaction solution is 4, and solid powder is obtained after removing solvent by rotatably evaporating, and the powder obtained was washed and subjected to suction filtration for three times using ethyl ether, thus obtaining white $C_{10}H_7CH_2NH_3I$ powder. $C_{10}H_7CH_2NH_3Br$, $C_{10}H_7CH_2NH_3Cl$, $C_6H_5CH_2NH_3I$, $C_6H_5(CH_2)_2NH_3I$ and $C_6H_5(CH_2)_4NH_3I$ were respectively synthesized according to this method.

Second Embodiment: Preparation of Layered Perovskite Material

A precursor solution was prepared by dissolving $C_{10}H_7CH_2NH_3$, $NH_2CH$=$NH_2I$ and $PbI_2$ with a molar ratio of 2:1:2, the above precursor solution was spin-coated on a substrate to obtain a layered perovskite film having a multiple quantum well structure (referred to as $NFPI_7$) after annealing.

As shown in FIG. 3, a $NFPI_7$ film has a strong exciton absorption peak at 569 nm, indicating that the major component of the perovskite film is (($C_{10}H_7CH_2NH_3$)$_2$($NH_2CH$=$NH_2$)[$Pb_2I_7$]), i.e., N=2. It can also be seen that the $NFPI_7$ film contains (($C_{10}H_7CH_2NH_3$)$_2PbI_4$) (i.e., N=1) and (($C_{10}H_7CH_2NH_3$)$_2$($NH_2CH$=$NH_2$)$_3$[$Pb_4I_{13}$]) (i.e., N=4) (X. Hong et al., Dielectric Confinement Effect on Excitons in $PbI_4$-Based Layered Semiconductors. *Phys. Rev. B*. 45, 6961-6964 (1992); K. Tanaka et al., Bandgap and exciton binding energies in lead-iodide-based natural quantum-well crystals. *Sci. Technol. Adv. Mater.* 4, 599-604 (2003).). FIG. 3 shows that the photoluminescence peak of the film is mainly located at 765 nm, which is approaching to the position of the emission peak of a 3D perovskite material, and meanwhile, the light emitting of the N=1, N=2 and N=4 perovskite materials also exists in the film. It can be seen from the absorption and photoluminescence spectra of the film that energy transfer from quantum wells with large exciton energy to quantum wells with small exciton energy exists in the $NFPI_7$ film. FIG. 4 is the excitation spectra of the $NFPI_7$ film. It can be seen that for different light emitting peak positions, the excitation peak positions are all from 569 nm, which further confirms the existence of energy transfer from N=2 quantum wells to quantum wells with small exciton energy in the $NFPI_7$ film. FIG. 5 is a schematic diagram showing "cascade" energy transfer existing in the $NFPI_7$ film having a multiple quantum well structure. FIG. 6 shows the morphology of the $NFPI_7$ film, indicating that the $NFPI_7$ film has better film-forming property, and the root-mean-square roughness thereof is 2.6 nm. FIG. 7 is the transient photoluminescence (PL) spectra of the $NFPI_7$ film measured by time-correlated single photon counting (TCSPC). It can be seen that the film has a short PL lifetime at short wavelengths, and the longer PL lifetime (10 ns) at 765 nm shows that the quantum wells with large N in the $NFPI_7$ film have very low defect density.

Third Embodiment: Layered Perovskite Material

A precursor solution was prepared by dissolving $C_{10}H_7CH_2NH_3I$, $NH_2CH$=$NH_2Br$ and $PbI_2$ with a molar ratio of 2:1:2, the above precursor solution was spin-coated on a substrate to obtain a layered perovskite film having a self-organized multiple quantum well structure (referred to as NFPI$_6$B) after annealing.

Figure 9:
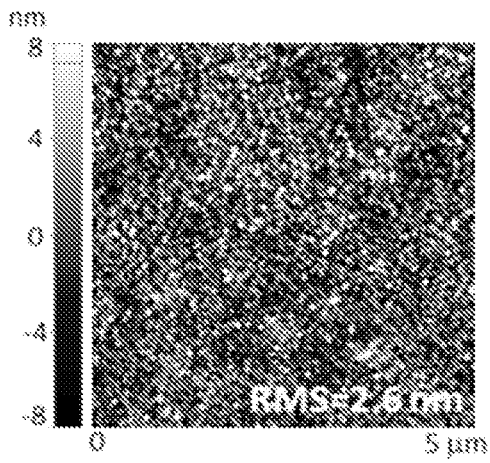
FIG. 9 is an AFM image of the perovskite film of the third embodiment provided by the present invention.
Figure 10:
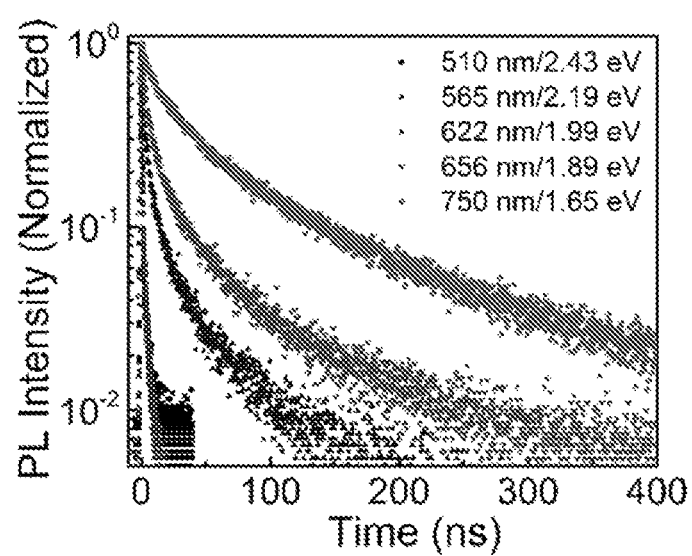
FIG. 10 is the time-resolved PL decay transient of the perovskite film under various excitation intensities of the third embodiment provided by the present invention.
Figure 11:
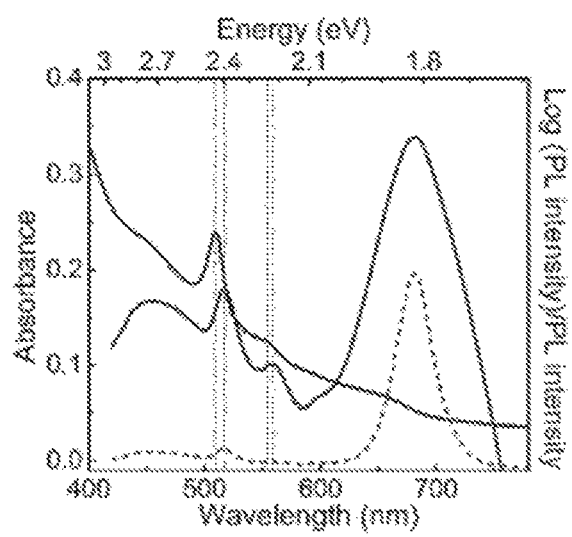
FIG. 11 is the absorption and photoluminescence spectra of a perovskite material of a fourth embodiment provided by the present invention.

As shown in FIG. 8, a NFPI$_6$B film presents a strong exciton absorption peak at 557 nm, and the photoluminescence peak thereof is mainly located at 750 nm, which is similar to the NFPI$_7$ film in the second embodiment. FIG. 9 shows the morphology of the NFPI$_6$B film, indicating that the NFPI$_6$B film has better film properties, and the root-mean-square roughness thereof is 2.6 nm. FIG. 10 shows the TCSPC test result of the NFPI$_6$B film. It can be seen that the PL lifetime of the film is relatively long at 750 nm, which reaches 30 ns.

Fourth Embodiment: Preparation of Layered Perovskite Material

A precursor solution was prepared by dissolving C$_{10}$H$_7$CH$_2$NH$_3$I, CsI and PbI$_2$ with a molar ratio of 2:1:2, the above precursor solution was spin-coated on a substrate to obtain a layered perovskite film having a self-organized multiple quantum well structure (referred to as NCsPI$_7$) after annealing.

Figure 12:
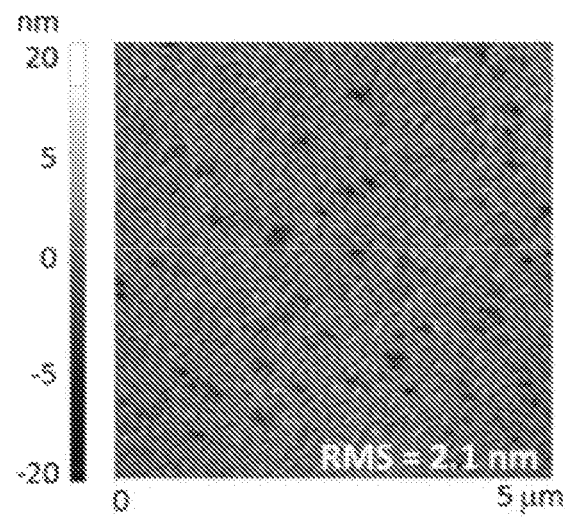
FIG. 12 is an AFM image of the perovskite film of the fourth embodiment provided by the present invention.

As shown in FIG. 9, a NCsPI$_7$ film presents a strong exciton absorption peak at 509 nm and 554 nm, and the photoluminescence peak thereof is mainly located at 681 nm, which is similar to the NFPI$_7$ film in the second embodiment. FIG. 12 shows the morphology of the NCsPI$_7$ film, indicating that the NFPI$_7$ film has better film-forming properties, and the root-mean-square roughness thereof is only 2.1 nm.

Fifth Embodiment: Preparation of Layered Perovskite Material

A precursor solution was prepared by dissolving C$_{10}$H$_7$CH$_2$NH$_3$I, CsCl and PbI$_2$ with a molar ratio of 2:1:2, the above precursor solution was spin-coated on a substrate to obtain a layered perovskite film having a self-organized multiple quantum well structure (referred to as NCsPI$_6$C) after annealing.

Figure 13:
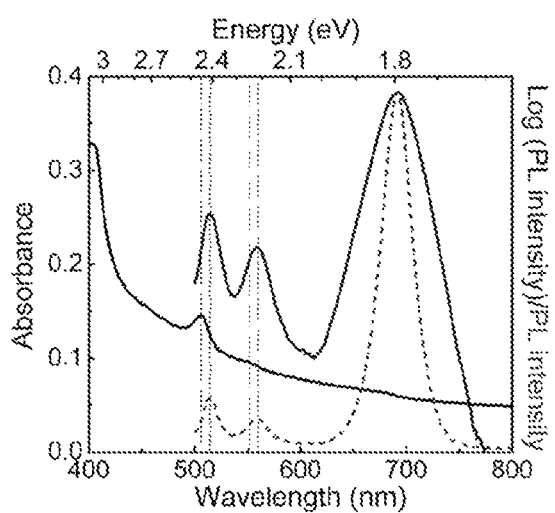
FIG. 13 is the absorption and photoluminescence spectra of a perovskite material of a fifth embodiment provided by the present invention.
Figure 14:
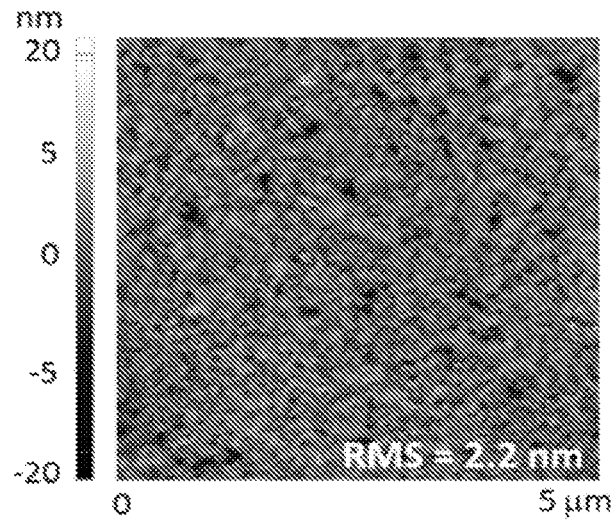
FIG. 14 is an AFM image of the perovskite film of the fifth embodiment provided by the present invention.

As shown in FIG. 13, a NCsPI$_6$C film presents a strong exciton absorption peak at 506 nm and 551 nm, and the photoluminescence peak thereof is mainly located at 692 nm, which is similar to the NFPI$_7$ film in the second embodiment. FIG. 14 shows the morphology of the NCsPI$_6$C film, indicating that the NCsPI$_6$C film has better film-forming properties, and the root-mean-square roughness thereof is only 2.2 nm.

Sixth Embodiment: Preparation of Layered Perovskite Material

A precursor solution was prepared by dissolving C$_{10}$H$_7$CH$_2$NH$_3$I, NH$_2$CH=NH$_2$I and PbI$_2$ with molar ratios of 6:2:5, 10:4:9, 2:1:2, 2:2:3, 2:3:4, 2:4:5, 2:5:6, 2:6:7 and 2:7:8, the above precursor solution was spin-coated on a substrate to obtain a layered perovskite film having a self-organized multiple quantum well structure after annealing.

Figure 15:
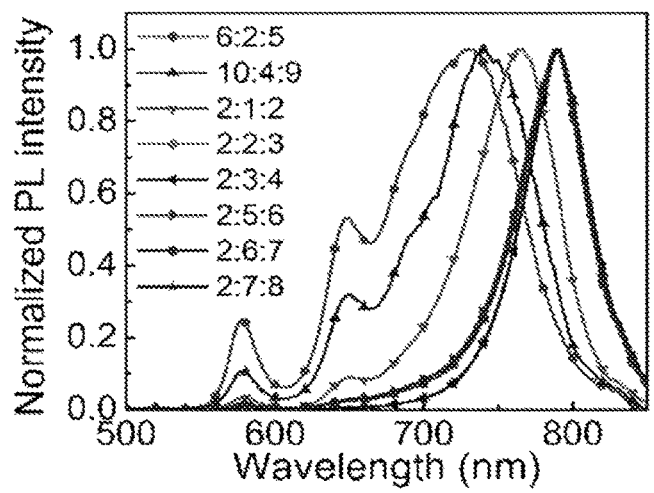
FIG. 15 is the photoluminescence spectra of perovskite materials with different structures of a sixth embodiment provided by the present invention.

As shown in FIG. 15, with the increasing of the NH$_2$CH=NH$_2$I content, the photoluminescence peak of the perovskite film gradually transfers from 730 nm to 789 nm.

Figure 16:
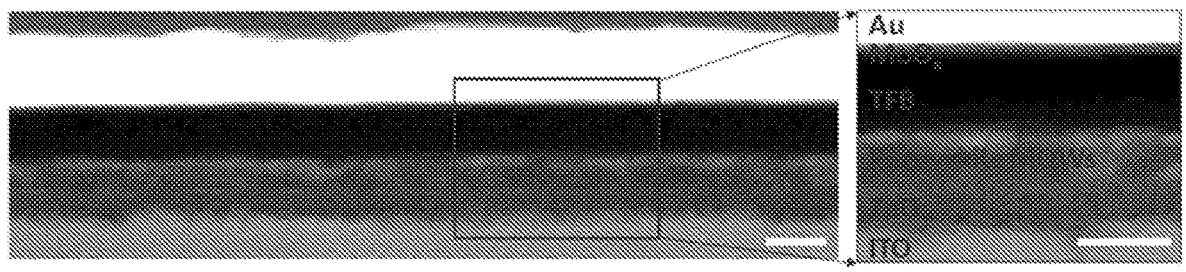
FIG. 16 is the cross-sectional STEM image of the MQW LED device of a seventh embodiment provided by the present invention.
Figure 17:
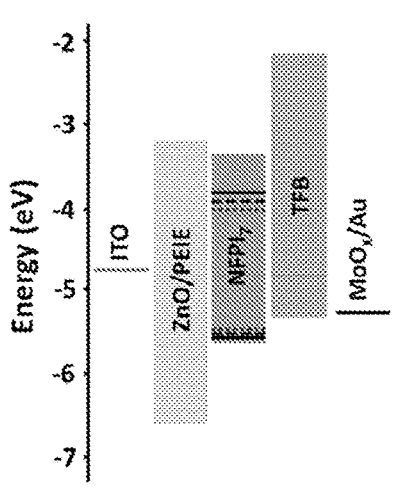
FIG. 17 is an energy level diagram of the MQW LED device of the seventh embodiment provided by the present invention.

Seventh Embodiment: Light Emitting Device (MQW LED) Based on Layered Perovskite Material As shown in FIG. 16 and FIG. 17, a substrate is an ITO-coated glass, an electron transport-hole blocking layer is ZnO/PEIE, a light emitting layer is NFPI$_7$, a hole transport-electron blocking layer is TFB, a top electrode is MoO$_x$/Au, and the entire structure of the device is described as: glass substrate/ITO/ZnO-PEIE (20 nm)/NFPI$_7$ (30 nm)/TFB (40 nm)/MoO$_x$ (7 nm)/Au (100 nm).

A preparation method is as follows.

① Transparent conductive ITO-coated substrate was subjected to ultrasonic cleaning using acetone solution, ethanol solution and deionized water, and blow-dried using dry nitrogen after cleaning, wherein an ITO film on the upper side of the glass substrate was served as a cathode layer of the device, and the sheet resistance of the ITO film was 15 Ω/sheet.

② The dried substrate was moved into a vacuum chamber, and the ITO glass was subjected to ultraviolet ozone pretreatment for 10 min under oxygen pressure.

③ ZnO and PEIE were respectively spin-coated on the treated substrate and annealed, then transferred into a nitrogen glovebox; a precursor solution prepared from C$_{10}$H$_7$CH$_2$NH$_3$I, NH$_2$CH=NH$_2$I and PbI$_2$ with a molar ratio of 2:1:2 was spin-coated on the substrate to obtain a perovskite film NFPI$_7$ having a multiple quantum well structure after annealing, and a TFB solution was spin-coated onto the perovskite layer as a hole transport layer.

④ After each functional layer was completely prepared, a MoO$_x$/Au combination electrode was prepared, wherein the atmospheric pressure was 6×10$^{-7}$ Torr, the evaporation rate was 0.1 nm/s, and the evaporation rate and thickness were monitored by using a quartz crystal monitor.

⑤ the prepared device was packaged in the glovebox, wherein the glovebox is in a 99.9% inert atmosphere.

⑥ The current-voltage-radiance features of the device were tested, and meanwhile, the luminescence spectrum parameters of the device were tested.

Figure 18:
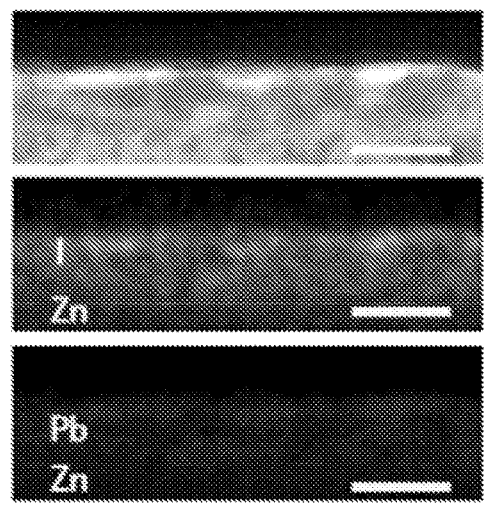
FIG. 18 is an element distribution diagram of a perovskite layer in the MQW LED device of the seventh embodiment provided by the present invention.
Figure 19:
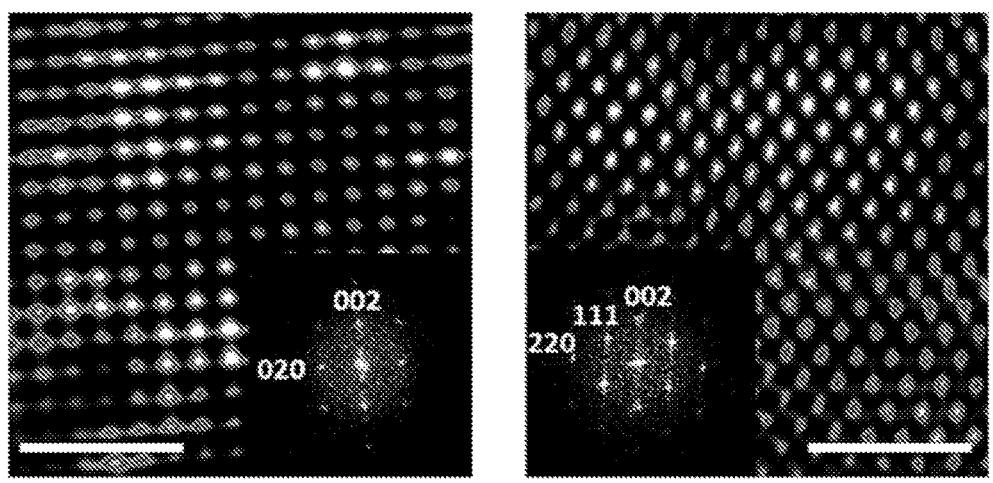
FIG. 19 is the HRTEM and FFT diagram of the perovskite layer in the MQW LED device of the seventh embodiment provided by the present invention.

It can be seen from the STEM diagram of the device in FIG. 16 that the NFPI$_7$ film has a bright portion at the NFPI$_7$/TFB interface, wherein this is because that the perovskite material having large N values are aggregated on the surface of the NFPI$_7$ film, which are consistent with the STEM element distribution diagram in FIG. 18. Moreover, high resolution transmission electron microscope (HRTEM) and fast fourier transform (FFT) analysis indicate that the perovskite material at the NFPI$_7$/TFB interface is a 3D perovskite material having a cubic structure with large N value, as shown in FIG. 19.

Figure 20:
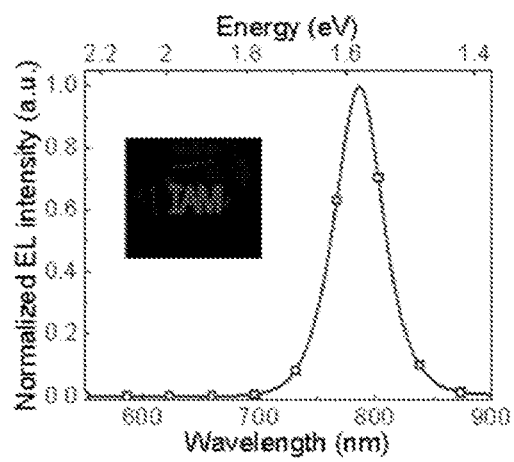
FIG. 20 is an electroluminescence spectrum of the MQW LED device and a photo of the MQW LED device of the seventh embodiment provided by the present invention.
Figure 21:
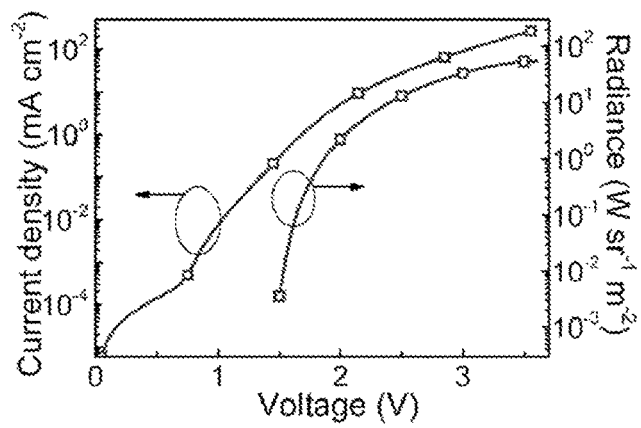
FIG. 21 is the dependence of current density and radiance on the driving voltage of the MQW LED device of the seventh embodiment provided by the present invention.
Figure 22:
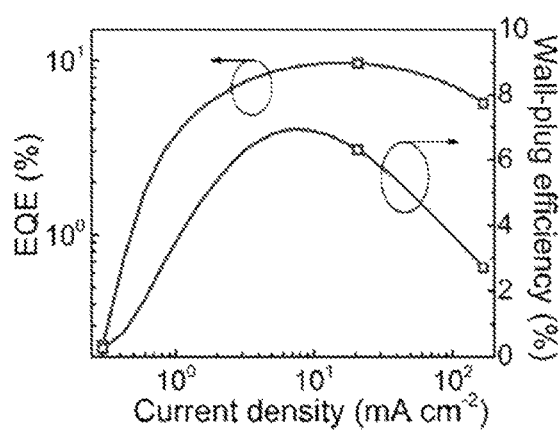
FIG. 22 is the dependence of external quantum efficiency and energy conversion efficiency on the current density of the MQW LED device of the seventh embodiment provided by the present invention.
Figure 23:
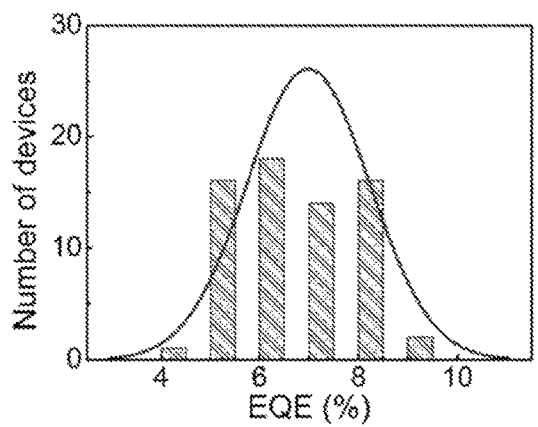
FIG. 23 is the histogram of peak EQEs of the MQW LED device of the seventh embodiment provided by the present invention.

FIG. 20 is an electroluminescence spectrum of the device and a photo of the device, wherein the emission peak of a near infrared light emitting device is 786 nm. The current density-voltage-radiance curve of the device is shown in FIG. 21. The near infrared perovskite LED turns on at a low voltage of 1.5 V; when the driving voltage is 3.6 V, the device reaches the maximum radiation intensity of 55 W/(sr·m$^2$). As shown in FIG. 22, the peak external quantum efficiency is 9.6%. As shown in FIG. 23, the EQE histogram indicates that the devices have better uniformity.

Eighth Embodiment: Light Emitting Device Based on Layered Perovskite Material The device employs a device structure identical to the seventh embodiment, wherein a light emitting layer is NFPI$_6$B, and the entire structure of the device is described as: glass substrate/ITO/ZnO-PEIE (20 nm)/NFPI$_6$B (30 nm)/TFB (40 nm)/MoO$_x$ (7 nm)/Au (100 nm).

A preparation method is similar to the seventh embodiment, wherein a precursor solution prepared from C$_{10}$H$_7$CH$_2$NH$_3$I, NH$_2$CH=NH$_2$Br and PbI$_2$ with a molar ratio of 2:1:2 was spin-coated on a substrate, thus obtaining a $NFPI_6B$ film having a perovskite structure after annealing.

Figure 24:
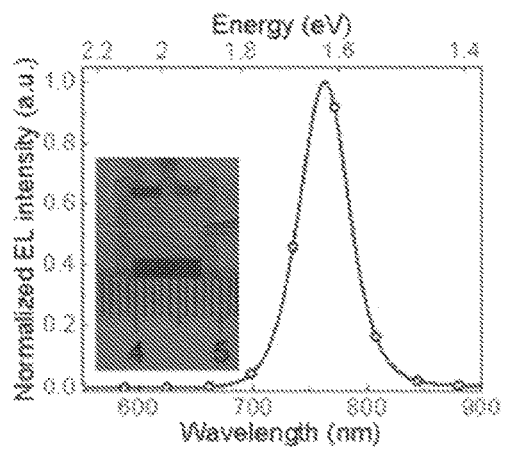
FIG. 24 is an electroluminescence spectrum of a MQW LED device and a photo of the large area MQW LED device of an eighth embodiment provided by the present invention.
Figure 25:
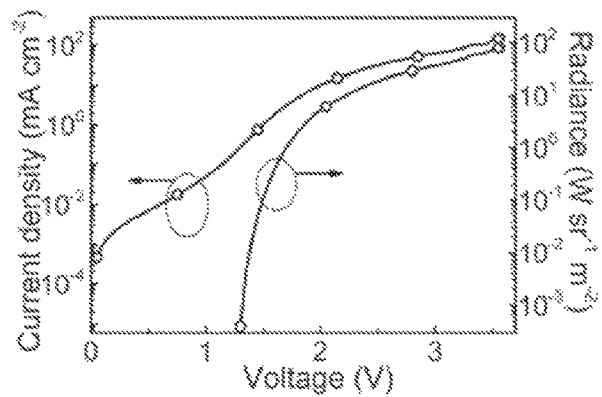
FIG. 25 is the dependence of current density and radiance on the driving voltage of the MQW LED device of the eighth embodiment provided by the present invention.
Figure 26:
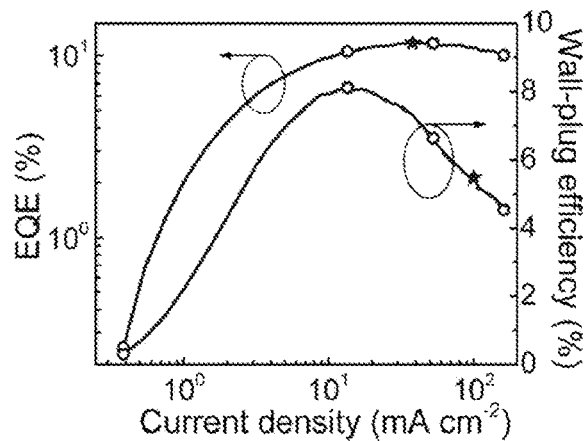
FIG. 26 is the dependence of external quantum efficiency and Wall-plug efficiency on the current density of the MQW LED device of the eighth embodiment provided by the present invention.
Figure 27:
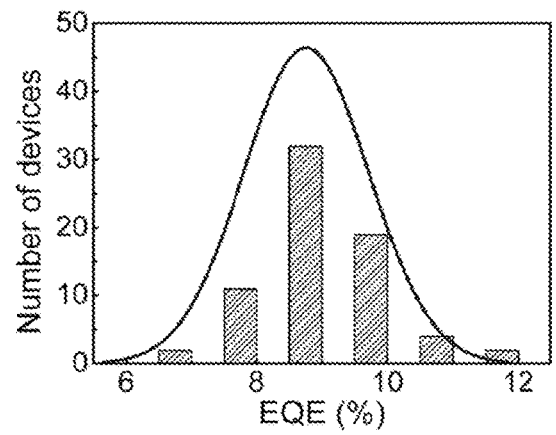
FIG. 27 is the histogram of peak EQEs of the MQW LED device of the eighth embodiment provided by the present invention.
Figure 28:
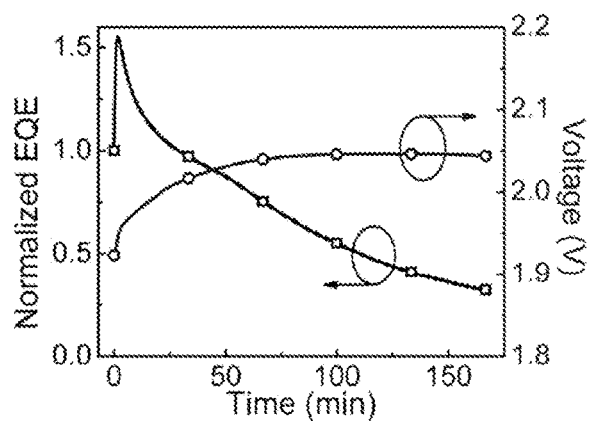
FIG. 28 is the stability of the MQW LED device of the eighth embodiment provided by the present invention.

FIG. 24 is an electroluminescence spectrum of the device and a photo of the device, the emission peak of a near infrared light emitting device is 763 nm, and meanwhile, large area (8 mm×8 mm) devices can be prepared. The current density-voltage-radiance curve of the device is shown in FIG. 25. The near infrared perovskite LED can turn on at a low voltage of 1.3 V; when the driving voltage is 3.6 V, the device reaches the maximum radiation intensity of 82 W/(sr·m$^2$). As shown in FIG. 26, the peak external quantum efficiency is 11.7%, and the internal quantum efficiency is 52%; the wall-plug efficiency reaches 5.5% at the current density of 100 mA/cm$^2$. As shown in FIG. 27, the EQE histogram indicates that the devices have better uniformity. Meanwhile, FIG. 28 shows that the device has better stability at a current density of 10 mA/cm$^2$.

Ninth Embodiment: Light Emitting Device Based on Layered Perovskite Material

The device employs a device structure identical to the seventh embodiment, wherein light emitting layer are respectively $NFPI_5B_2$, $NFPI_4B_3$, $NFPI_3B_4$, $NFPI_2B_5$ and $NFPB_7$, and the entire structure of the device is described as: glass substrate/ITO/ZnO-PEIE (20 nm)/light emitting layer (30 nm)/TFB (40 nm)/MoO$_x$ (8 nm)/Au (100 nm).

A preparation method is similar to the seventh embodiment, wherein a precursor solution prepared from $C_{10}H_7CH_2NH_3Br$, $NH_2CH=NH_2I$ and $PbI_2$, $C_{10}H_7CH_2NH_3Br$, $NH_2CH=NH_2Br$ and $PbI_2$, $C_{10}H_7CH_2NH_3I$, $NH_2CH=NH_2I$ and $PbBr_2$ as well as $C_{10}H_7CH_2NH_3Br$, $NH_2CH=NH_2Br$ and $PbBr_2$ with a molar ratio of 2:1:2 and a precursor solution prepared from $C_{10}H_2CH_2NH_3Br$, $NH_2CH=NH_2Br$, $PbBr_2$ and $PbI_2$ with a molar ratio of 2:1:1:1 were spin-coated on a substrate, thus obtaining $NFPI_6B_2$, $NFPI_4B_3$, $NFPI_3B_4$, $NFPB_7$ and $NFPI_2B_5$ perovskite films having a self-organized quantum well structure after annealing.

Figure 29:
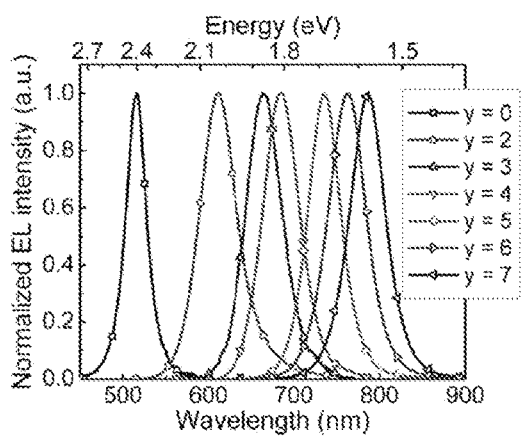
FIG. 29 is the electroluminescence spectra of a MQW LED device of a ninth embodiment provided by the present invention.

FIG. 29 is the electroluminescence spectra of the devices. It can be seen that light emitting devices with emission peaks at 786 nm, 763 nm, 736 nm, 685 nm, 664 nm, 611 nm and 518 nm can be implemented by adjusting X components in the perovskite materials.

Tenth Embodiment: Light Emitting Device Based on Layered Perovskite Material

The device employs a device structure identical seventh embodiment, wherein a light emitting layer is NFPI6C, and the entire structure of the device is described as: glass substrate/ITO/ZnO-PEIE (20 nm)/$NFPI_6C$ (30 nm)/TFB (40 nm)/MoO$_x$ (7 nm)/Au (100 nm).

A preparation method is similar to the seventh embodiment, wherein a precursor solution prepared from $C_{10}H_7CH_2NH_3I$, $NH_2CH=NH_2Cl$ and $PbI_2$ with a molar ratio of 2:1:2 was spin-coated on a substrate, thus obtaining a $NFPI_6C$ film having a perovskite structure after annealing.

Figure 30:
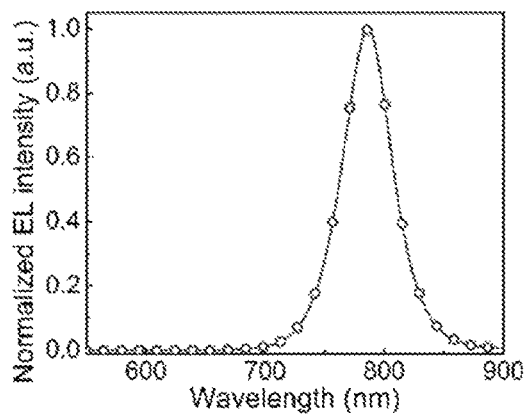
FIG. 30 is an electroluminescence spectrum of a MQW LED device of a tenth embodiment provided by the present invention.
Figure 31:
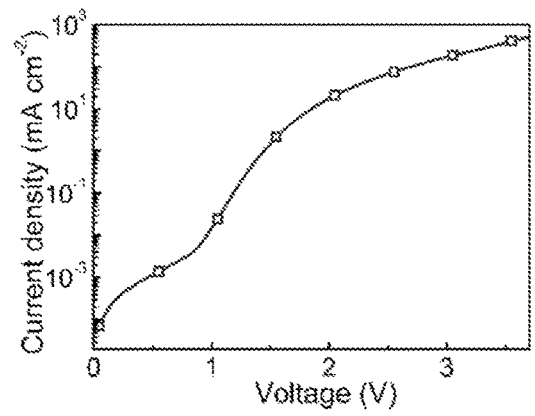
FIG. 31 is the dependence of current density on the driving voltage of the MQW LED device of the tenth embodiment provided by the present invention.
Figure 32:
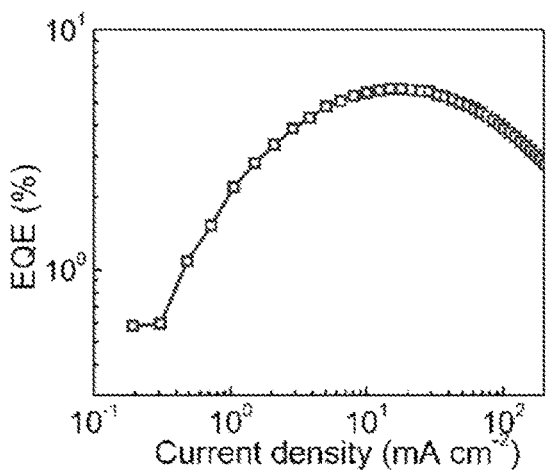
FIG. 32 is the dependence of external quantum efficiency on the current density of the MQW LED device of the tenth embodiment provided by the present invention.

FIG. 30 is an electroluminescence spectrum of the device, wherein the emission peak of a near infrared light emitting device is 786 nm. The current density-voltage curve of the device is shown in FIG. 31. As shown in FIG. 32, the near infrared perovskite LED can turn on at a low voltage of 1.3 V, and the peak external quantum efficiency is 5.6%.

Eleventh Embodiment: Light Emitting Device Based on Layered Perovskite Material

The device employs a device structure identical seventh embodiment, wherein a light emitting layer is $NMPI_2$, and the entire structure of the device is described as: glass substrate/ITO/ZnO-PEIE (20 nm)/$NMPI_2$ (30 nm)/TFB (40 nm)/MoO$_x$ (7 nm)/Au (100 nm).

A preparation method is similar to the seventh embodiment, wherein a precursor solution prepared from $C_{10}H_7CH_2NH_3I$, $CH_3NH_3I$ and $PbI_2$ with a molar ratio of 2:1:2 was spin-coated on a substrate, thus obtaining a $NMPI_7$ film having a perovskite structure after annealing.

Figure 33:
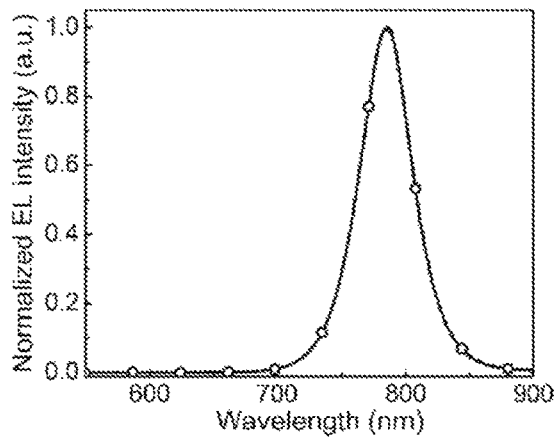
FIG. 33 is an electroluminescence spectrum of a MQW LED device of an eleventh embodiment provided by the present invention.
Figure 34:
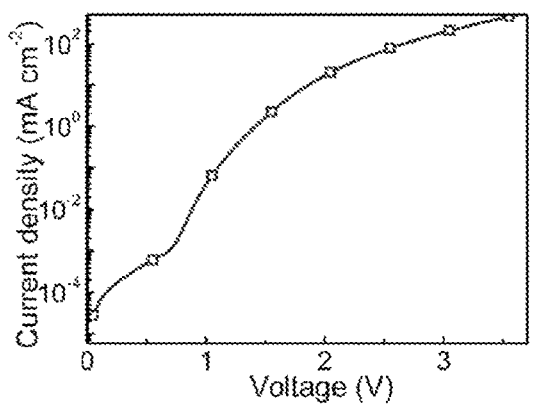
FIG. 34 is the dependence of current density on the driving voltage of the MQW LED device of the eleventh embodiment provided by the present invention.
Figure 35:
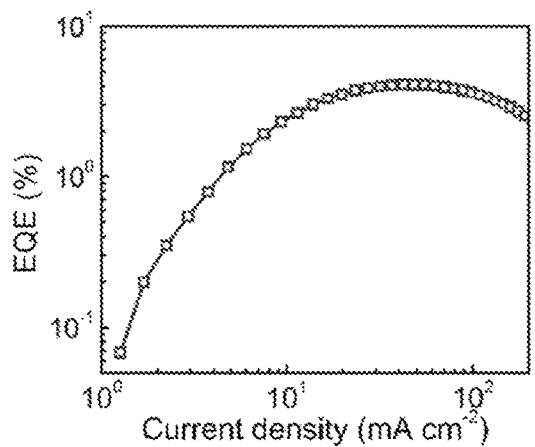
FIG. 35 is the dependence of external quantum efficiency on the current density of the MQW LED device of the eleventh embodiment provided by the present invention.

FIG. 33 is an electroluminescence spectrum of the device, wherein the emission peak of a near infrared light emitting device is 784 nm. The current density-voltage curve of the device is shown in FIG. 34. As shown in FIG. 35, the near infrared perovskite LED can turn on at a low voltage of 1.4 V, and the peak external quantum efficiency is 4.1%.

Twelfth Embodiment: Light Emitting Device Based on Layered Perovskite Material

The device employs a device structure identical seventh embodiment, wherein a light emitting layer is $PFPI_6B$, and the entire structure of the device is described as: glass substrate/ITO/ZnO-PEIE (20 nm)/$PFPI_6B$ (30 nm)/TFB (40 nm)/MoO$_x$ (7 nm)/Au (100 nm).

A preparation method is similar to the seventh embodiment, wherein a precursor solution prepared from $C_6H_6CH_2NH_3I$, $NH_2CH=NH_2Br$ and $PbI_2$ with a molar ratio of 2:1:2 was spin-coated on a substrate, thus obtaining a $PFPI_6B$ film having a perovskite structure after annealing.

Figure 36:
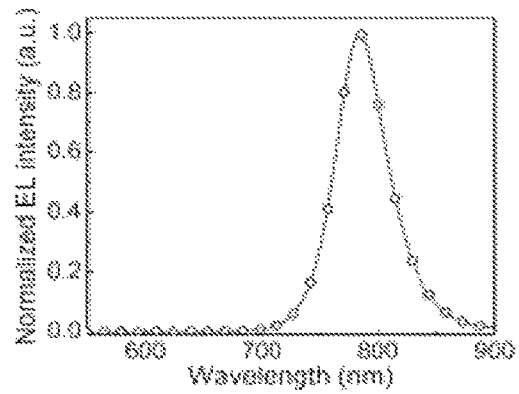
FIG. 36 is an electroluminescence spectrum of a MQW LED device of a twelfth embodiment provided by the present invention.
Figure 37:
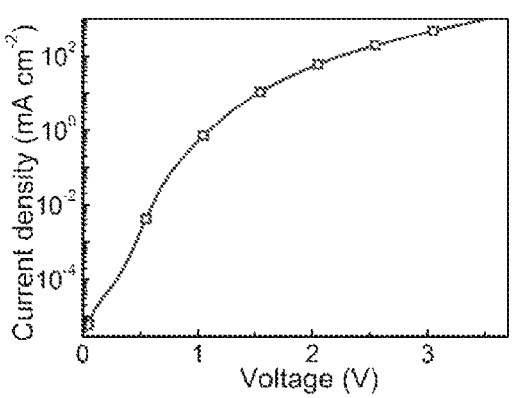
FIG. 37 is the dependence of current density on the driving voltage of the MQW LED device of the twelfth embodiment provided by the present invention.
Figure 38:
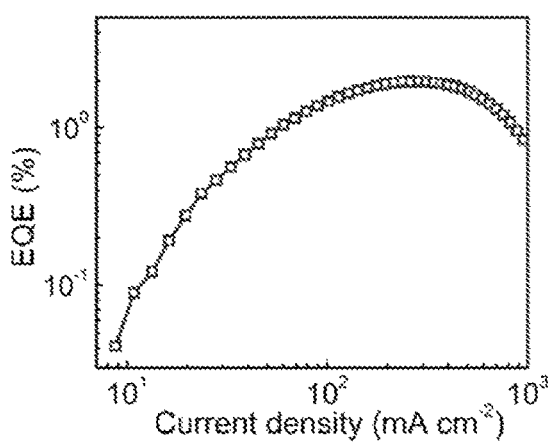
FIG. 38 is the dependence of external quantum efficiency on the current density of the MQW LED device of the twelfth embodiment provided by the present invention.

FIG. 36 is an electroluminescence spectrum of the device, wherein the emission peak of a near infrared light emitting device is 785 nm. The current density-voltage curve of the device is shown in FIG. 37. As shown in the near infrared perovskite LED can turn on at a low voltage of 1.5 V, and the peak external quantum efficiency is 2.0%.

Thirteenth Embodiment: Light Emitting Device Based on Layered Perovskite Material The device employs a device structure identical seventh embodiment, wherein a light emitting layer is $PEAFPI_6B$, and the entire structure of the device is described as: glass substrate/ITO/ZnO-PEIE (20 nm)/$PEAFPI_6B$ (30 nm)/TFB (40 nm)/MoO$_x$ (7 nm)/Au (100 nm).

A preparation method is similar to the seventh embodiment, wherein a precursor solution prepared from $C_6H_5(CH_2)_4NH_3I$, $NH_2CH=NH_2Br$ and $PbI_2$ with a molar ratio of 2:1:2 was spin-coated on a substrate, thus obtaining a $PEAFPI_6B$ film having a perovskite structure after annealing.

Figure 39:
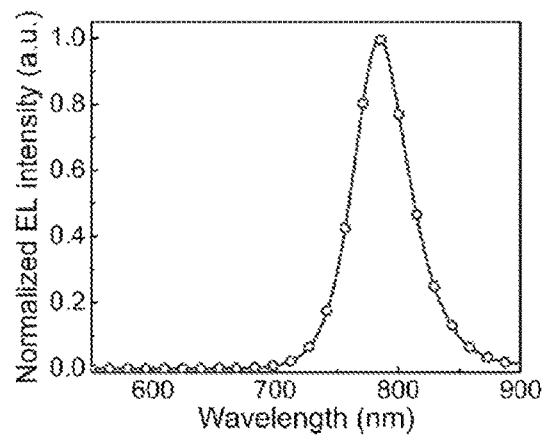
FIG. 39 is an electroluminescence spectrum of a MQW LED device of a thirteenth embodiment provided by the present invention.
Figure 40:
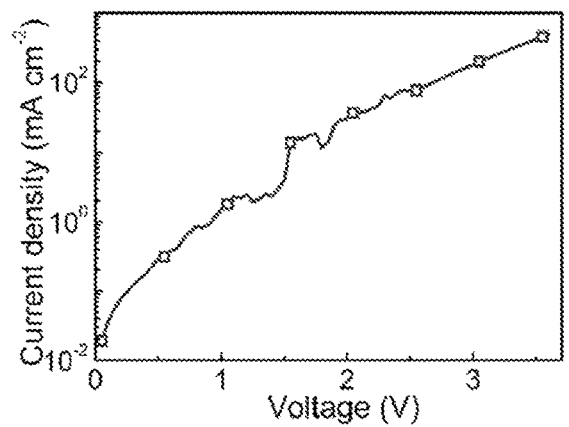
FIG. 40 is the dependence of current density on the driving voltage of the MQW LED device of the thirteenth embodiment provided by the present invention.
Figure 41:
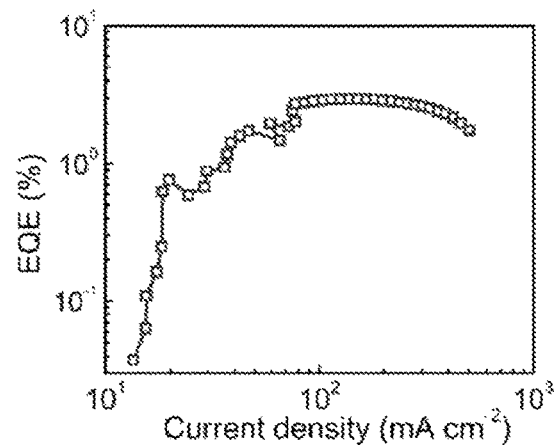
FIG. 41 is the dependence of external quantum efficiency on the current density of the MQW LED device of the thirteenth embodiment provided by the present invention.

FIG. 39 is an electroluminescence spectrum of the device, wherein the emission peak of a near infrared light emitting device is 785 nm. The current density-voltage curve of the device is shown in FIG. 40. As shown in FIG. 41, the near infrared perovskite LED can turn on at a low voltage of 1.5 V, and the peak external quantum efficiency is 2.9%.

Fourteenth Embodiment: Light Emitting Device Based on Layered Perovskite Material The device employs a device structure identical seventh embodiment, wherein a light emitting layer is $PBAFPI_6B$, and the entire structure of the device is described as: glass substrate/ITO/PBAFPI$_6$B (30 nm)/TFB (40 nm)/MoO$_x$ (7 nm)/Au (100 nm).

A preparation method is similar to the seventh embodiment, wherein a precursor solution prepared from $C_6H_5(CH_2)_4NH_3I$, $NH_2CH=NH_2Br$ and $PbI_2$ with a molar ratio of 2:1:2 was spin-coated on a substrate, thus obtaining a PBAFPI$_6$B film having a perovskite structure after annealing.

Figure 42:
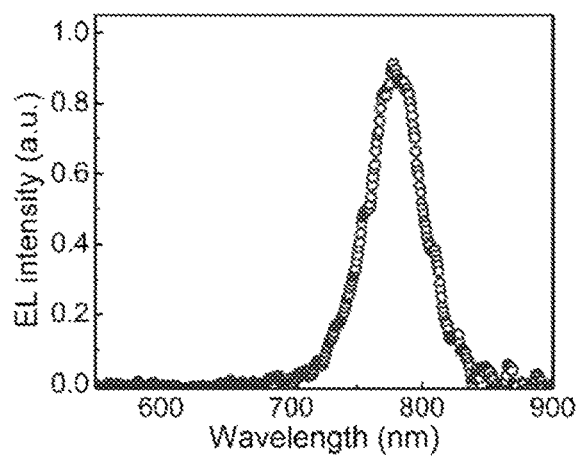
FIG. 42 is an electroluminescence spectrum of a MQW LED device of a fourteenth embodiment provided by the present invention.
Figure 43:
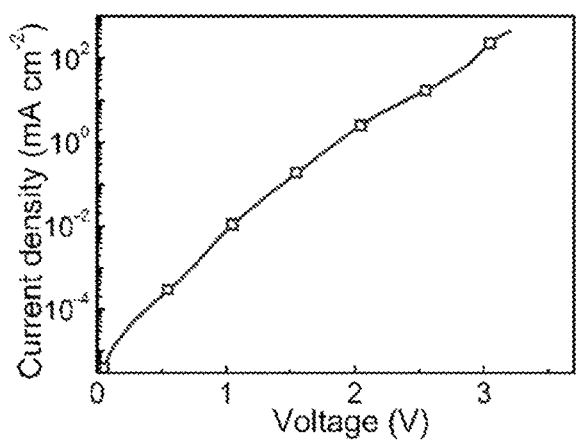
FIG. 43 is the dependence of current density on the driving voltage of the MQW LED device of the fourteenth embodiment provided by the present invention.
Figure 44:
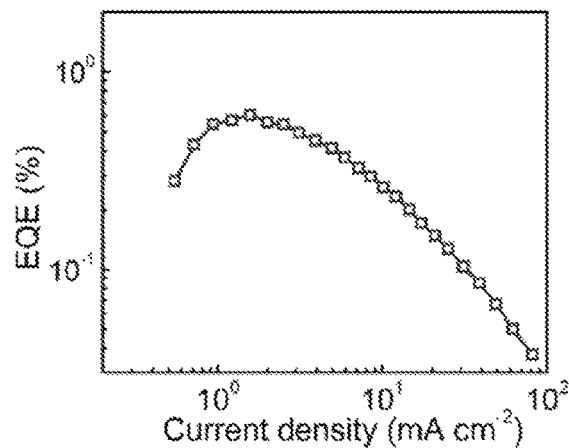
FIG. 44 is the dependence of external quantum efficiency on the current density of the MQW LED device of the fourteenth embodiment provided by the present invention.

FIG. 42 is an electroluminescence spectrum of the device, wherein the emission peak of a near infrared light emitting device is 777 nm. The current density-voltage curve of the device is shown in FIG. 43. As shown in FIG. 44, the near infrared perovskite LED can turn on at a low voltage of 1.7 V, and the peak external quantum efficiency is 0.6%.

Fifteenth Embodiment: Light Emitting Device Based on Layered Perovskite Material The device employs a device structure identical to the seventh embodiment, wherein the NCsPI$_7$ in the fourth embodiment is employed as the material of a light emitting layer, and the entire structure of the device is described as: glass substrate/ITO/ZnO-PEIE (20 nm)/NCsPI$_7$ (30 nm)/TFB (40 nm)/MoO$_x$ (7 nm)/Au (100 nm). A preparation method is similar to the seventh embodiment.

Figure 45:
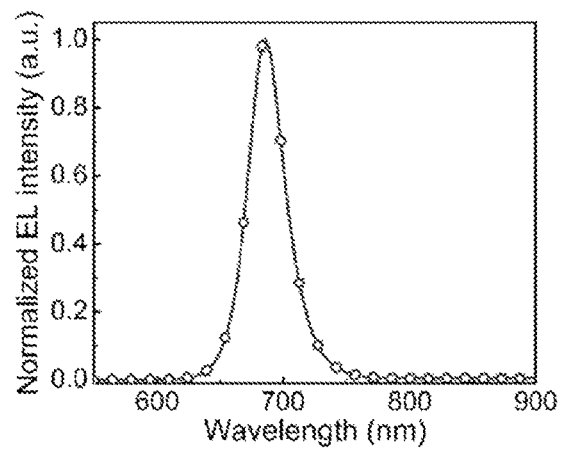
FIG. 45 is an electroluminescence spectrum of a MQW LED device of a fifteenth embodiment provided by the present invention.
Figure 46:
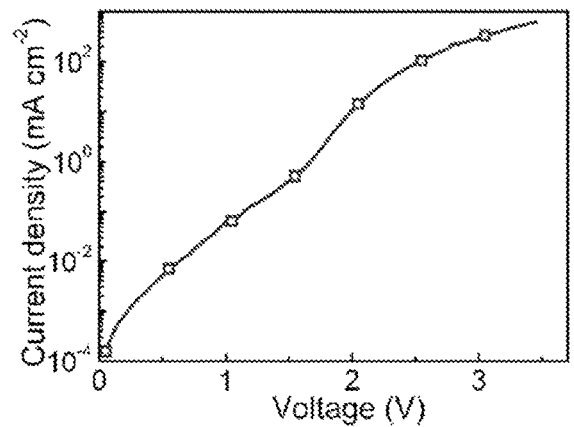
FIG. 46 is the dependence of current density on the driving voltage of the MQW LED device of the fifteenth embodiment provided by the present invention.
Figure 47:
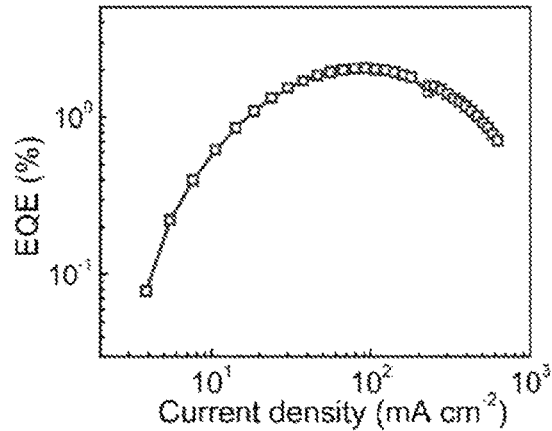
FIG. 47 is the dependence of external quantum efficiency on the current density of the MQW LED device of the fifteenth embodiment provided by the present invention.

FIG. 45 is an electroluminescence spectrum of the device, wherein the emission peak of a red light emitting device is 686 nm. The current density-voltage curve of the device is shown in FIG. 46. As shown in FIG. 47, a red light perovskite LED can turn on at a low voltage of 1.8 V, and the peak external quantum efficiency is 2.0%.

Sixteenth Embodiment: Light Emitting Device Based on Layered Perovskite Material The device employs a device structure identical to the seventh embodiment, wherein the NCsPI$_6$C in the fifth embodiment is employed as the material of a light emitting layer, and the entire structure of the device is described as: glass substrate/ITO/ZnO-PEIE (20 nm)/NCsPI$_6$C (30 nm)/TFB (40 nm)/MoO$_x$ (7 nm)/Au (100 nm). A preparation method is similar to the seventh embodiment.

Figure 48:
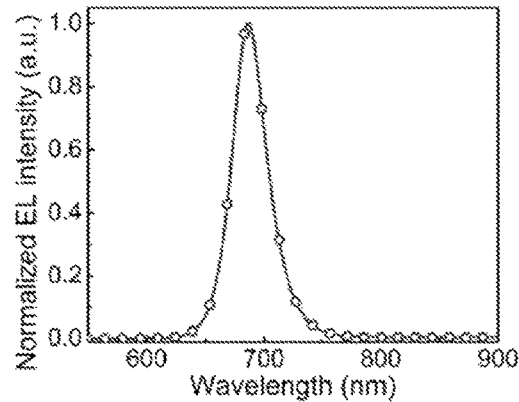
FIG. 48 is an electroluminescence spectrum of a MQW LED device of a sixteenth embodiment provided by the present invention.
Figure 49:
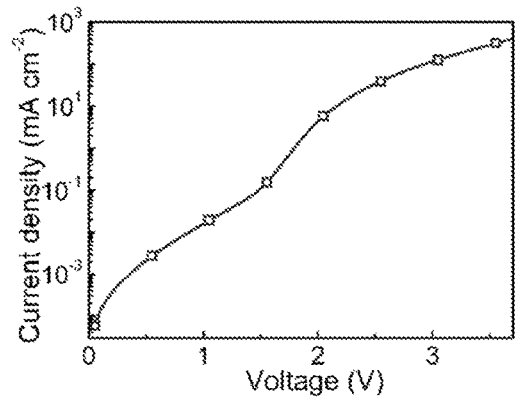
FIG. 49 is the dependence of current density on the driving voltage of the MQW LED device of the sixteenth embodiment provided by the present invention.
Figure 50:
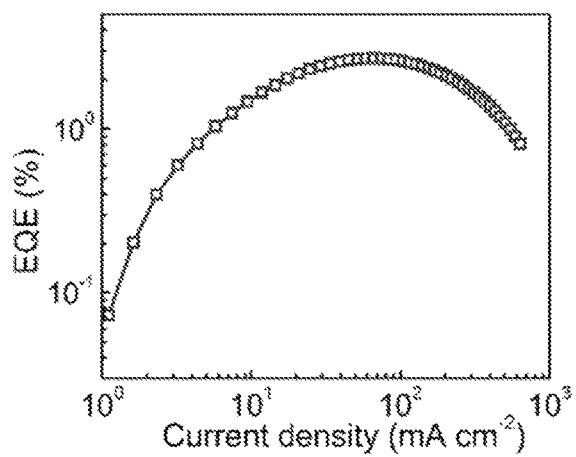
FIG. 50 is the dependence of external quantum efficiency on the current density of the MQW LED device of the sixteenth embodiment provided by the present invention.

FIG. 48 is an electroluminescence spectrum of the device, wherein the emission peak of a red light emitting device is 686 nm. The current density-voltage curve of the device is as shown in FIG. 49. As shown in FIG. 50, a red light perovskite LED can turn on at a low voltage of 1.8 V, and the maximum external quantum efficiency is 2.7%.

Seventeenth Embodiment: Light Emitting Device Based on Layered Perovskite Material The device employs a device structure identical seventh embodiment, wherein a light emitting layer is NFCsPI$_6$B, and the entire structure of the device is described as: glass substrate/ITO/ZnO-PEIE (20 nm)/NFCsPI$_6$B (30 nm)/TFB (40 nm)/MoO$_x$ (7 nm)/Au (100 nm).

A preparation method is similar to the seventh embodiment, wherein a precursor solution prepared from C$_{10}$H$_7$CH$_2$NH$_3$I, NH$_2$CH=NH$_2$Br, CsBr and PbI$_2$ with a molar ratio of 2:0.9:0.1:2 was spin-coated on a substrate, thus obtaining a NFCsPI$_6$B film having a perovskite structure after annealing.

Figure 51:
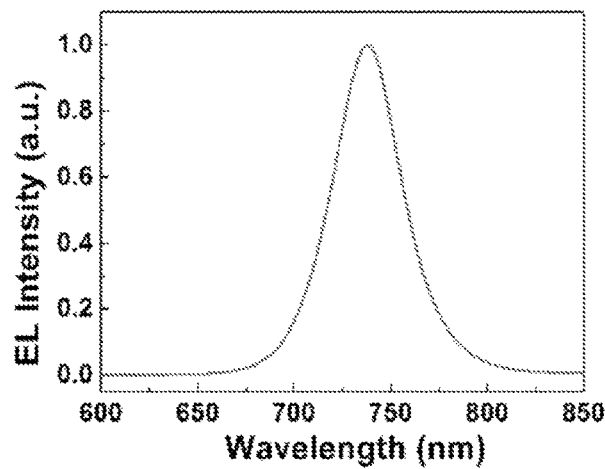
FIG. 51 is an electroluminescence spectrum of a MQW LED device of a seventeenth embodiment provided by the present invention.
Figure 52:
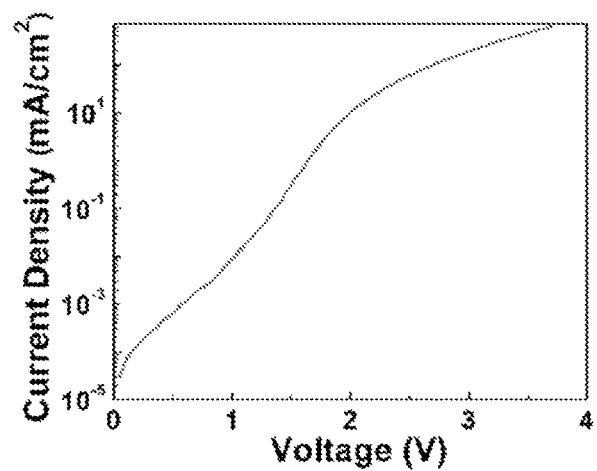
FIG. 52 is the dependence of current density on the driving voltage of the MQW LED device of the seventeenth embodiment provided by the present invention.
Figure 53:
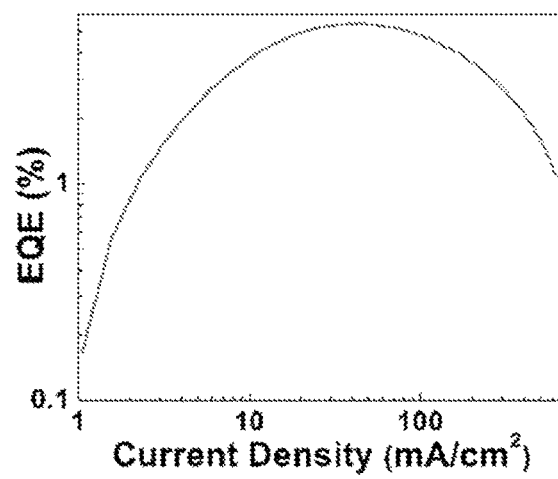
FIG. 53 is the dependence of external quantum efficiency on the current density of the MQW LED device of the seventeenth embodiment provided by the present invention.

FIG. 51 is an electroluminescence spectrum of the device, wherein the emission peak of a light emitting device is 738 nm. The current density-voltage curve of the device is shown in FIG. 52. As shown in FIG. 53, the near infrared perovskite LED can turn on at a low voltage of 1.7 V, and the peak external quantum efficiency is 5.4%.

Eighteenth Embodiment: Light Emitting Device Based on Layered Perovskite Material The device employs NFPI$_7$ as a photoactive layer, and the entire structure of the device is described as: glass substrate/ITO/PEDOT:PSS (40 nm)/NFPI$_7$ (100 nm)/PCBM (40 nm)/Al (100 nm).

Figure 54:
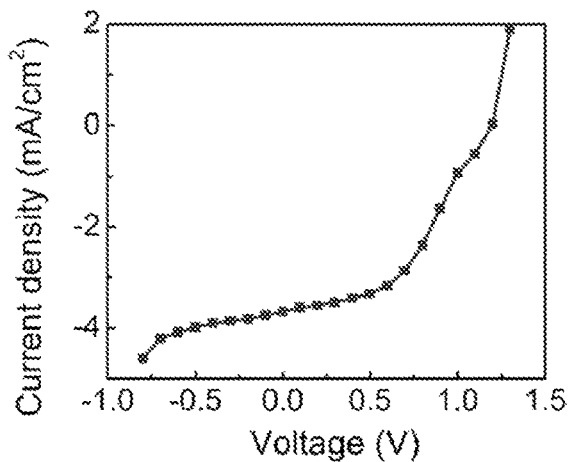
FIG. 54 is the dependence of current density on the driving voltage of a perovskite photovoltaic device of an eighteenth embodiment provided by the present invention.

FIG. 54 is a current-voltage curve of the above perovskite photovoltaic device under illumination, wherein the open circuit voltage of the device V$_{OC}$=1.2 V, the short circuit current density is J$_{SC}$=3.7 mA/cm$^2$, the fill factor FF=0.46, and the efficiency is 2%.

Nineteenth Embodiment: Light Emitting Device Based on Layered Perovskite Material The device employs NFPI$_7$ as a photoactive layer, and the entire structure of the device is described as: glass substrate/ITO/c-TiO$_x$ (40 nm)/m-TiO$_x$ (100 nm)/NFPI$_7$ (100 nm)/Spiro-OMeTAD (110 nm)/Al (100 nm).

Figure 55:
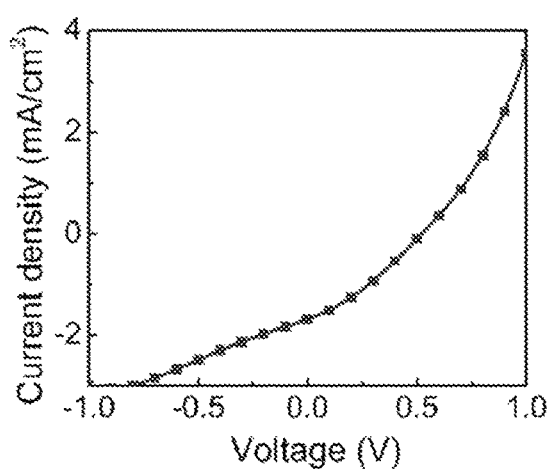
FIG. 55 is the dependence of current density on the driving voltage of a perovskite photovoltaic device of a nineteenth embodiment provided by the present invention.
Figure 56:
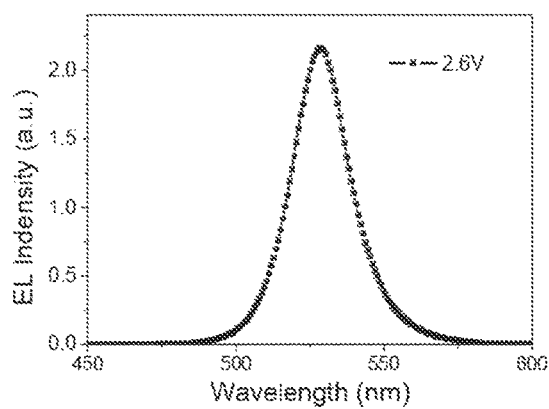
FIG. 56 is an electroluminescence spectrum of a MQW LED device of the 20th embodiment provided by the present invention.
Figure 57:
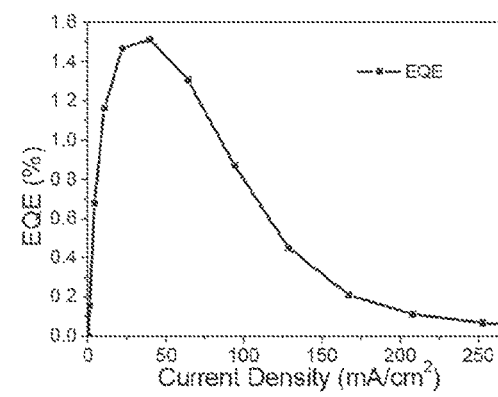
FIG. 57 is the dependence of current density on the driving voltage of the MQW LED device of the 20th embodiment provided by the present invention.

FIG. 55 is a current-voltage curve of the above perovskite photovoltaic device under illumination, wherein the open circuit voltage of the device V$_{OC}$=0.5 V, the short circuit current density thereof is J$_{SC}$=1.7 mA/cm$^2$, the fill factor FF=0.33, and the efficiency is 0.3%.

The layered perovskite material possessing a self-organized multiple quantum well structure described above has the advantages of simple preparation process, high quality, and good stability, and is very suitable for industrialized production of devices with low cost, large area and flexible substrate. The device prepared according to the material of the present invention can be combined into various consumption products, including a solar cell, a flat display device, a completely transparent display device, a flexible display device, an internal or external lighting/signaling light source, a laser printer, a mobile phone, a vehicle or the like.

The embodiments in this description are described in a progressive manner, description of each of the embodiments is mainly focused on differences between the embodiment and the other embodiments, and the same or similar elements between the embodiments may be cross-referenced. The above description of the disclosed embodiments enables those skilled in the art to implement or use the present application. Various modifications to those embodiments will be apparent for those skilled in the art. The general principle defined herein may be implemented in other embodiments without departing from the spirit or the scope of the present application, including a laser device similar to the design concept of the present invention. Any technical method complied with the principle and novel features disclosed herein, or formed employing equivalent transformation or equivalent substitution shall all fall within the right protection scope of the present invention.

What is claimed is:

1. A perovskite optoelectronic device, comprising a substrate, electrode layers and functional layers, the electrode layer is deposited on the substrate, the functional layer is deposited between the electrode layers, and the functional layer at least comprises a perovskite layer, wherein the perovskite layer is a perovskite material having a self-organized multiple quantum well structure, and energy transfers can be implemented between the multiple quantum wells;

wherein the perovskite material has a chemical formula as shown as A$_2$B$_{n-1}$M$_n$X$_{3n+1}$, n is an integer and >2, A is $R^1$—$Y^+$ or $R^1$—$(Y^+)_2$, and $R^1$ is aliphatic hydrocarbyl having 1-50 carbon atoms, cycloaliphatic hydrocarbyl having 5-100 carbon atoms, optionally substituted aryl having 6-100 carbon atoms or optionally substituted heterocyclic radical having 3-100 carbon atoms, and $Y^+$ is any one of amine, pyridine or imidazole organic cation;

B is $R^2$—$NH_3^+$ or alkali metal ion, and $R^2$ is a group having one carbon atom;

M is a metallic element or $Ge^{2+}$, and

X is a halogen;

the self-organized multiple quantum wells comprise quantum wells with variable energy gaps between 0.1 eV-5 eV, the energy gaps thereof being distributed from wide to narrow, from narrow to wide or distributed randomly.

2. The perovskite optoelectronic device according to claim 1, wherein the perovskite material is prepared from $AX^1$, $BX^2$ and $MX^3_2$ with a molar ratio of 1-100:1-100:1-100;

$X^1$, $X^2$ and $X^3$ are halogen elements respectively and independently.

3. The perovskite optoelectronic device according to claim 2, wherein A is $R^1$—$Y^+$, and $R^1$ is aliphatic hydrocarbyl having 1-20 carbon atoms, cycloaliphatic hydrocarbyl having 5-50 carbon atoms, optionally substituted aryl having 6-50 carbon atoms or optionally substituted heterocyclic radical having 3-50 carbon atoms, and r is any one of amine, pyridine or imidazole organic cation.

4. The perovskite optoelectronic device according to claim 3, wherein A is selected from any one or more of the following organic cations:

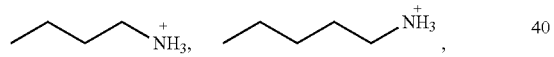

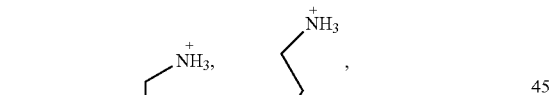

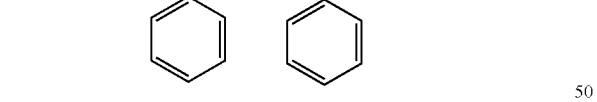

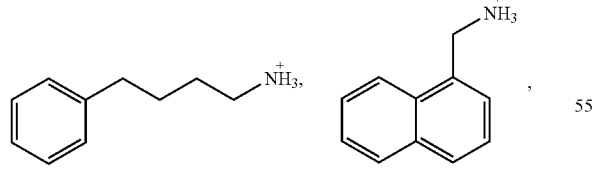

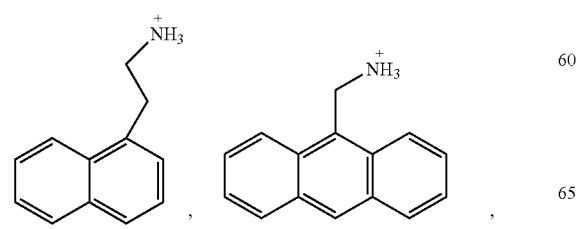

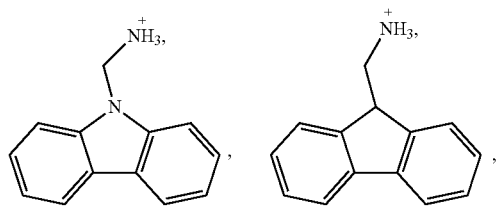

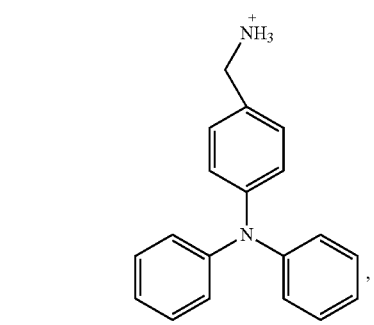

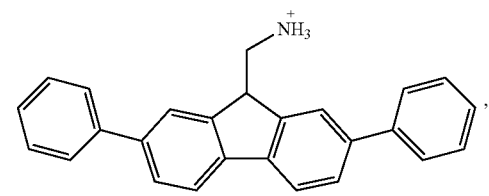

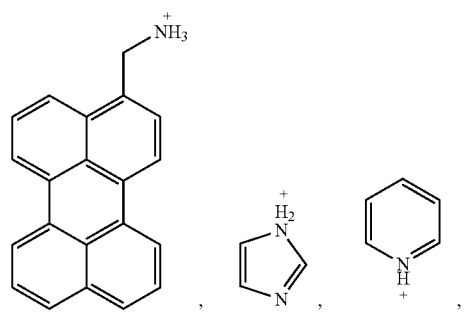

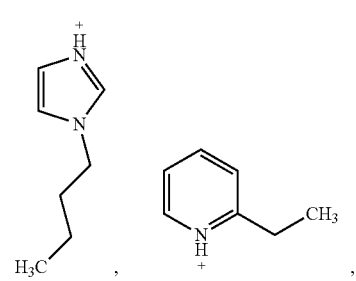

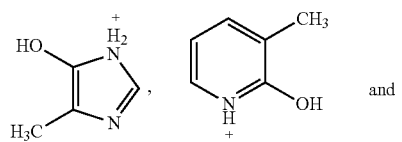 and

-continued

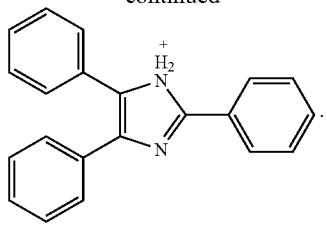

5. The perovskite optoelectronic device according to claim 2, wherein A is $R^1$—$(Y^+)_2$, and $R^1$ is aliphatic hydrocarbyl having 1-20 carbon atoms, cycloaliphatic hydrocarbyl having 5-50 carbon atoms, optionally substituted aryl having 6-50 carbon atoms or optionally substituted heterocyclic radical having 3-50 carbon atoms, and $Y^+$ is any one or any combination of several of amine, pyridine or imidazole organic cation.

6. The perovskite optoelectronic device according to claim 5, wherein A is selected from any one or more of the following organic cations:

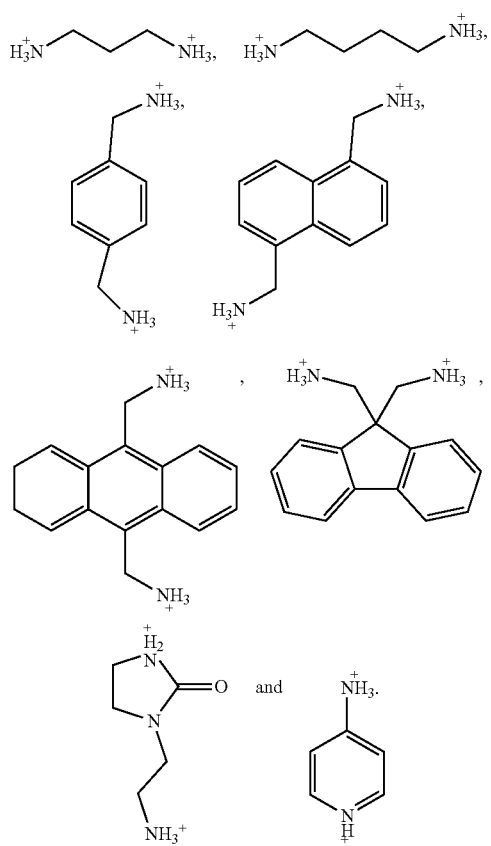

7. The perovskite optoelectronic device according to claim 2, wherein B is any one or any combination of several of organic amine groups like methylamine and formamidinium, $K^+$, $Rb^+$ and $Cs^+$.

8. The perovskite optoelectronic device according to claim 2, wherein M is any one of $Pb^{2+}$, $Ge^{2+}$ and $Sn^{2+}$, or any one of transition metals $Cu^{2+}$, $Ni^{2+}$, $Co^{2+}$, $Fe^{2+}$, $Mn^{2+}$, $Cr^{2+}$, $Pd^{2+}$, $Cd^{2+}$, $Eu^{2+}$ and $Yb^{2+}$, or a combination of several of above elements.

9. The perovskite optoelectronic device according to claim 2, wherein $X^1$, $X^2$ and $X^3$ are selected from any one or any combination of several of Cl, Br and I respectively and independently.

10. The perovskite optoelectronic device according to claim 2, wherein the perovskite material is prepared by employing a method of spin-coating a precursor solution prepared by $AX^1$, $BX^2$ and $MX^3_2$ on the substrate, and evaporating the precursor material using an evaporation method, or employing a method of combining the evaporation method with a solution method, which has a self-organized multiple quantum well structure, and energy transfer between the multiple quantum wells can be implemented.

11. A preparation method for the perovskite optoelectronic device according to claim 1, comprising the following steps of:
(1) using an acetone solution, an ethanol solution and deionized water to conduct ultrasonic cleaning on a substrate in sequence, and drying the substrate after cleaning;
(2) transferring the substrate to a vacuum chamber to prepare an electrode layer;
(3) transferring the substrate with a prepared electrode layer into a vacuum chamber for oxygen plasma pre-treatment;
(4) depositing functional layers on the treated substrate in sequence through a solution method according to the structure of the device, wherein the functional layer at least comprises a perovskite layer, and selectively comprises any one or more of an electronic and/or hole transport layer, an electronic and/or hole blocking layer;
(5) preparing another electrode layer in a vacuum evaporation chamber after finishing the preparation of the functional layer films; and
(6) packaging the prepared device in a glovebox, wherein the glovebox is in an inert atmosphere.

12. The preparation method for the perovskite optoelectronic device according to claim 11, wherein in step (4), functional layers are prepared on the treated substrate using an evaporation method, and the functional layers are evaporated in sequence according to the structure of the device; or the functional layers are prepared in the high vacuum chamber in sequence on the treated substrate using a method of combining an evaporation method with a solution method according to the structure of the device.

* * * * *